United States Patent [19]
Slattery et al.

[11] Patent Number: 5,859,604
[45] Date of Patent: Jan. 12, 1999

[54] MERGED VLSI IMPLEMENTATION OF HARDWARE OPTIMIZED Q-CODER AND SOFTWARE OPTIMIZED QM-CODER

[75] Inventors: Michael John Slattery, Jerico, Vt.; Joan LaVerne Mitchell, Cortlandt Manor, N.Y.

[73] Assignee: International Business Machines Corporation, Armonk, N.Y.

[21] Appl. No.: 783,254

[22] Filed: Jan. 14, 1997

[51] Int. Cl.$^6$ .................................................. H03M 7/00
[52] U.S. Cl. .............................. 341/107; 341/50; 341/51; 341/61; 341/67; 341/106
[58] Field of Search .................. 341/50, 51, 61, 341/67, 106, 107

[56] References Cited

U.S. PATENT DOCUMENTS

| | | |
|---|---|---|
| 4,633,490 | 12/1986 | Goertzel et al. . |
| 4,791,403 | 12/1988 | Mitchell et al. . |
| 4,891,643 | 1/1990 | Mitchell et al. . |
| 4,905,297 | 2/1990 | Langdon, Jr. et al. . |
| 4,933,883 | 6/1990 | Pennebaker et al. . |
| 4,935,882 | 6/1990 | Pennebaker et al. . |
| 5,099,440 | 3/1992 | Pennebaker et al. . |
| 5,381,145 | 1/1995 | Allen et al. . |
| 5,414,423 | 5/1995 | Pennebaker . |
| 5,442,458 | 8/1995 | Rabbani et al. . |
| 5,475,388 | 12/1995 | Gormish et al. . |
| 5,500,923 | 3/1996 | Kuroshima et al. ............... 395/114 |
| 5,610,657 | 3/1997 | Zhang ................................. 348/415 |
| 5,615,287 | 3/1997 | Fu et al. .............................. 382/232 |
| 5,629,780 | 5/1997 | Watson ................................ 358/432 |
| 5,689,589 | 11/1997 | Gormish et al. ................... 382/239 |
| 5,706,366 | 1/1998 | Jung .................................... 382/232 |
| 5,708,511 | 1/1998 | Gandhi et al. ...................... 358/426 |

OTHER PUBLICATIONS

"Lossless Compress: Hot it Workds", Simon, Barry, *PC Magazine*, vol. 12, No. 12, p. 305, Jun. 29, 1993.

"Cache 101: What Your Mother Should Have Told You", Vaughan–Nichols, Steven, *Computer Shopper*, vol. 12, No. 6, p. 724, Jun. 1992.

"The JPEG Still Picture Compression Standard", Wallace, Gregory K., *Communications of the ACM*, vol. 34, No. 4, p. 30, Apr., 1991.

"Arithmetic Coding and Statistical Modeling: Achieving Higher Compression Rates", Nelson, Mark, *Dr. Dobb's Journal*, vol. 16, No. 2, p. 16, Feb., 1996.

*Primary Examiner*—Marc S. Hoff
*Assistant Examiner*—Jason L W Kost
*Attorney, Agent, or Firm*—Calfee, Halter & Griswold LLP

[57] ABSTRACT

The present invention includes a method and circuit for the compression encoding and decoding of digital images. In particular, the method is directed to an improved implementation of the QM-Coder as defined in the JBIG Standard and a merged implementation of the QM-Coder as defined in the JBIG Standard with the Q-Coder as defined by the IBM ABIC standard. The improved implementation of the QM-Coder as defined in the JBIG Standard includes an improved CLEARBITS procedure. The merged implementation of the QM-Coder as defined in the JBIG Standard and Q-Coder as defined by the ABIC standard includes the sharing of hardware to reduce implementation logic.

11 Claims, 28 Drawing Sheets

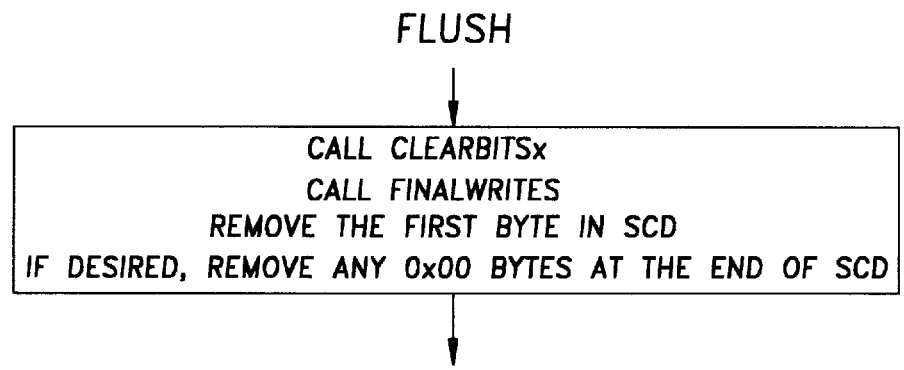
FIG. 11
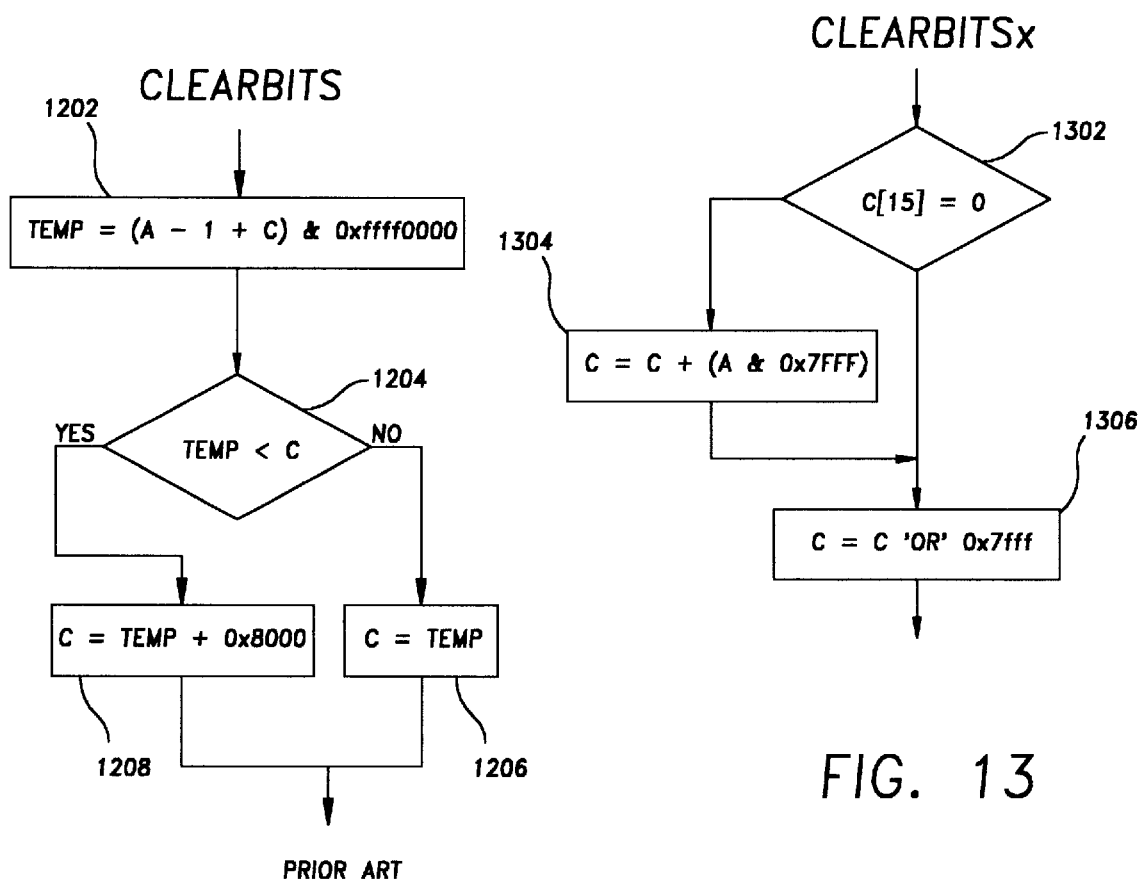
FIG. 12 PRIOR ART
FIG. 13

MERGED VLSI IMPLEMENTATION OF HARDWARE OPTIMIZED Q-CODER AND SOFTWARE OPTIMIZED QM-CODER

FIELD OF THE INVENTION

The present invention relates generally to compression and decompression methods and circuits for digital images and, more specifically, to a method and circuit for a merged VLSI implementation of a hardware optimized ABIC Q-Coder and a software optimized JBIG QM-Coder into a Qx-Coder. The present invention further relates to a circuit and method for a hardware optimized implementation of a JBIG QM-Coder compression and decompression standard.

BACKGROUND OF THE INVENTION

Information has always been a valuable commodity to society. With the advent of computers and digital information exchanges, such as the Internet, the volume of information being generated is exploding. Therefore, the ability to store, access and transmit information quickly and efficiently has become crucial. In particular, with the advent of digital cameras, recorders, scanners and facsimiles (i.e. fax), the ability to store, access and transmit digital images in an efficient manner has found particular importance.

One method of storing, accessing and transmitting data quickly and efficiently involves what is known as data compression and decompression. On a general level, data compression entails the coding of original data into secondary data, from which, the original data can again be derived. Generally, the secondary or coded data, will be quantitatively less than the original data.

Data compression falls into two general categories: lossy and lossless. In a lossy system, data is compressed with the knowledge and foresight that the decompressed data will not be an identical replica of the compressed data, but only a close approximation. Conversely, a lossless system is one that produces an exact replica of the original data from the compressed data. An important technique in the compression of data is known as arithmetic coding. In arithmetic coding, data is typically represented by one or more symbols. An arithmetic encoder takes a stream of input symbols and replaces it with a binary fraction. The binary fraction is a single number, less than 1 and greater than or equal to 0. An arithmetic decoder decodes this single number to create the exact stream of input symbols that went into the encoder. The arithmetic encoder and decoder rely upon set probabilities assigned to each symbol for their proper operation. However, these set probabilities may also be adaptive and the assignment of adaptive probabilities to symbols requires the use of a probability estimator.

In arithmetic coding, an image is represented as a binary fraction between 0 and 1. The range of 0 to 1 defines what is known as an interval. In its simplest form, arithmetic coding assigns a probability between 0 and 1 to a symbol. For example, suppose the input symbol string to be encoded is "ae." Suppose further that the only two symbols to be encoded are "a" and "e" and that they occur in a ratio of three to one (3:1), respectively. Therefore, the probability that "a" will occur is ¾ or 0.75 and the probability that "e" will occur is ¼ or 0.25. In this case, "a" is said to be the More Probable Symbol (MPS) and "e" is said to be the Less Probable Symbol (LPS) based on their respective probabilities. Since the first symbol to be encoded is "a", the final code for the input symbol string "ae" must lie inside the "a" range, or between 0 and 0.75. To encode the "e", which follows "a", we further subdivide the now encoded "a" range of 0 to 0.75 proportionately based on the 3:1 "a" to "e" ratio. Therefore, the final code for the input symbol string "ae", after "e" has been encoded, will lie in the range of 0.5625 to 0.75. Taking the middle value of this range, the input symbol string "ae" is now encoded as a fraction of 0.65625. In this fashion, larger input symbol strings can be encoded by the same process of proportionally dividing successive interval ranges based on previously input symbols. The more symbols that are encoded, the smaller the interval range becomes, and the larger the number of significant digits that are required. For a more detailed discussion on arithmetic coding, see Pennebaker, W. B. and J. L. Mitchell, *JPEG: Still Image Data Compression Standard* (Van Nostrand Reinhold 1993) pp. 135–147.

In 1986, IBM successfully developed an adaptive arithmetic coding architecture to implement an Adaptive Bi-level Image Compression (hereinafter ABIC) standard. The ABIC standard employs an entropy coder and entropy coding concepts. For a more detailed description of the entropy coder and entropy coding concepts, see Pennebaker, W. B., *JPEG: Still Image Data Compression Standard*, pp. 135–147 (1993). The entropy coder, also known as the "Q-Coder," is more fully described in "Arithmetic Coding Encoder and Decoder System," U.S. Pat. No. 4,905,297, issued to G. G. Langdon, Jr., et al., (hereinafter Langdon Patent) which is hereby fully incorporated by reference. The Q-Coder included an arithmetic coder, decoder and a probability estimator. The Q-coder utilized uncompressed data to determine the LPS probability estimate (Qe) for the data to be compressed and then coded the data based thereon. The decoder functions similarly but in reverse order. The probability estimator updates its probabilities (Qe's) based on successive coding events. In essence, the probability estimator of the Q-Coder improved coder and decoder performance through probability adaptation of the Qe values. Further descriptions of the Q-Coder can also be found in Mitchell, J. L., and W. B. Pennebaker, "Software Implementations of the Q-Coder," *IBM Journal of Research and Development*, Vol. 32, No. 6, November, 1988, pp. 753–774, and in Arps, R. B. et al., "A Multi-Purpose VLSI Chip for Adaptive Data Compression of Bi-Level Images," *IBM Journal of Research and Development*, Vol. 32, No. 6, November, 1988, pp. 775–795.

However, in 1988, the Joint Bi-Level Image Experts Group (JBIG) of ISO/IEC JTC1/SC29/WG9 and CCITT SGVIII was formed to establish a standard for the progressive encoding of bi-level images. In 1993, the JBIG Experts Group published International Standard ISO/IEC 11544:1993(E) entitled *Information Technology—Coded Representation of Picture and Audio Information—Progressive Bi-Level Image Compression* (hereinafter JBIG Standard). The JBIG Standard's implementation of arithmetic coding is also known as the QM-Coder, which describes the coder's technical ancestry to IBM's Q-Coder.

Both the ABIC Q-Coder and the JBIG QM-Coder employ templates to take advantage of observed patterns in an image. A template is a geometric pattern describing the location of pixels relative to a current pixel to be coded. From a template, an integer known as a context is generated and used to identify the index of the state of the adaptive arithmetic coder to be used for coding the current pixel. Templates are well-known in the art and for more information, see International Standard ISO/IEC 11544:1993(E) and Arps, R. B. et al., "A Multi-Purpose VLSI Chip for Adaptive Data Compression of Bi-Level Images," *IBM Journal of Research and Development*, pp. 775–795 (1988).

The JBIG Standard's QM-Coder outputs Protected Stripe Coded Data (PSCD) that is defined as the bytes of a Stripe Data Entity (SDE) that remain after removing a terminating two bytes. A decoder creates Stripe Coded Data (SCD) from the PSCD by replacing all occurrences of an escape (ESC) byte followed by a "Stuffed" byte with a single ESC byte. The encoder creates the PSCD from the SCD by replacing all occurrences of an ESC byte with an ESC byte followed by a stuff byte. Stuff bytes are 0x00 bytes and are used for unambiguously distinguishing between predefined escape (ESC) bytes, which are 0xff bytes, indicating the start of a marker segment and bytes identical to the escape byte which naturally occur in a compressed data stream. For more information on the PSCD, SCD and ESC bytes, see the International Standard ISO/IEC 11544:1993(E).

The JBIG Standard's QM-Coder defines a method for the compression encoding of a bi-level image (e.g. black and white) that is generally optimized for software implementation. IBM's Adaptive Bi-level Image Compression (ABIC) Q-Coder implements an arithmetic coding algorithm using hardware conventions. Accordingly, since hardware conventions and software conventions need not be the same, and can even be opposite in nature, IBM's ABIC Q-Coder appeared to be incompatible with the JBIG Standard.

U.S. Pat. No. 4,891,643, "Arithmetic Coding Data Compression/Decompression by Selectively Employed, Diverse Arithmetic Coding Encoders and Decoders," issued to Mitchell et al. (hereinafter Mitchell et al.) describes that one may convert between hardware and software conventions for arithmetic coding by inverting data streams according the methods described therein. (See also, J. L. Mitchell and W. B. Pennebaker, "Optimal Hardware and Software Arithmetic Coding Procedures for the Q-Coder," IBM J. Res. Develop., 32, 727–736 (1988)). Therefore, the concept of inverting data streams to arrive at hardware and software compatibility standards in arithmetic coding is well-known in the art. However, with the advent of the JBIG Standard and its particular software conventions, a simple inversion of the data stream according to the teachings of the prior art did not provide the proper coding/decoding compatibility.

Moreover, since logic can be implemented in both software and hardware conventions and since certain logic can be implemented easier in software than in hardware, and vice-versa, the prior art did not provide hardware developers of the JBIG Standard an optimized hardware standard to follow since the JBIG Standard was defined by software conventions. Furthermore, the prior art did not provide a standard for hardware developers for implementing a JBIG Standard and an ABIC standard on a shared and optimized hardware architecture.

SUMMARY OF THE INVENTION

According to the present invention, a method of terminating compression encoding of data in a computer system employing a JBIG compression standard is provided. The computer system includes a code register and an interval size register, wherein the code register includes a boundary of an interval and the interval size register includes an interval length. The method of terminating compression encoding of digital images employing the JBIG Standard includes the steps of: reading a 16th bit of the code register; comparing the 16th bit of the code register to a first state; if the 16th bit of the code register is equal to the first state, adding the low order 15 bits of the interval size register to the low order 16 bits of the code register; setting the state of the low order 15 bits of the code register to a second state. The method further includes the step of outputting the code register contents.

The present invention also provides a method of compression encoding of digital images employing a JBIG Standard in a computer system. The computer system includes a code register and an interval size register, wherein the code register includes a boundary of an interval and the interval size register comprises an interval length. The method of compression encoding includes the steps of: initializing an encoder procedure; encoding at least one pixel value; and terminating the step of encoding. The step of initializing an encoder includes the steps of storing an interval length value in the interval size register and storing a boundary value in the code register. The step of terminating the step of encoding includes the steps of: reading a 16th bit of the code register; comparing the 16th bit of the code register to a first state; if the 16th bit of the code register is equal to the first state, adding the low order 15 bits of the interval size register to the low order 16 bits of the code register; setting the state of the low order 15 bits of the code register to a second state. The method further includes the step of outputting the code register contents.

Moreover, the present invention also provides a circuit for the compression encoding of digital images employing a JBIG Standard. The circuit includes a code register for storing a boundary of an interval, wherein the code register includes at least 16 bits that include a low order 15 bit segment, and wherein each bit of the code register includes a state; an interval size register for storing an interval length, wherein the interval size register includes at least 16 bits that include a low order 15 bit segment, and wherein each bit of the interval size register includes a state; encoder logic for encoding pixel data; and termination logic for terminating the encoding of pixel data. The termination logic includes logic for adding the low order 15 bits of the interval size register to the low order 15 bits of the code register; logic for determining the state of the 16th bit of the code register; logic for setting the state of the low order 15 bits of the code register to a second state. The logic for adding the low order 15 bits of the interval size register to the low order 15 bits of the code register register includes an arithmetic logic unit. The logic for determining the state of the 16th bit includes an OR gate.

The present invention also provides a merged VLSI implementation of a hardware optimized ABIC Q-coder and software optimized JBIG QM-coder. The merged implementation is known as the Qx-Coder. In the Qx-Coder, an ABIC 13-bit A register is located in the high order 13 bits of the 16-bit JBIG A register. Similarly, an ABIC Q-Coder C register is shifted left 3 bits in the JBIG C register. This configuration allows the output byte to be co-located in the hardware. The JBIG hardware optimized compressed data is inverted at the output to create the identical JBIG software optimized compressed data.

The present invention also provides a method of implementing a JBIG and an ABIC compression/decompression standard in a common hardware structure, wherein the common hardware structure includes a code register having a code register bit assignments and an interval size register having interval size register bit assignments. The method comprising the steps of: determining whether a JBIG or an ABIC standard is required; modifying the code register bit assignments if an ABIC standard is required, wherein the step of modifying the register bit assignments includes the step of shifting the code register bit register bit assignments by 3 bits; and modifying the interval size register bit assignments if an ABIC standard is required, wherein the step of modifying the interval size register bit assignments includes the step of shifting the interval size register bit assignments by 3 bits. The method also includes the step of inverting stripe coded data (SCD) if the JBIG standard is required.

Additionally, the present invention also provides a method for implementing a JBIG compression/decompression standard, the method comprising the steps of: initializing an encoder; reading image information; encoding at least one pixel value to an output value, wherein the output value includes a first state; inverting the state of the output value; and outputting the inverted output value, wherein the inverted output value is in compliance with the JBIG compression/decompression standard.

The present invention also provides a hardware architecture for implementing a JBIG compression/decompression standard comprising: logic for initializing an encoder; logic for reading image information; logic for encoding at least one pixel value to an output value, wherein the output value includes a first state; logic for inverting the output value to a second state; and logic for outputting the inverted output value, wherein the inverted output value is in compliance with the JBIG compression/decompression standard.

It is therefore an advantage of this invention to provide a hardware optimized JBIG QM-Coder.

It is a further advantage of this invention to provide an improved JBIG CLEARBITS software procedure and hardware implementation.

It is also a further advantage of the present invention to provide a merged VLSI implementation of a hardware optimized ABIC Q-coder and hardware optimized JBIG QM-coder.

The method and apparatus of the present invention thus provides a method and circuit for common implementation of the IBM ABIC standard and the JBIG International Standard with shared hardware. The method and apparatus of the present invention also provides an improved CLEARBITS procedure that requires less hardware and execution time than the JBIG International Standard CLEARBITS procedure.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIGS. 4–11, 13 and 14 are flowcharts illustrating a hardware optimized implementation of the JBIG International Standard (QM-Coder) that allows sharing of hardware with IBM's ABIC Q-Coder.

FIG. 12 is flowchart of the JBIG CLEARBITS procedure.

FIG. 13 is flowchart of an CLEARBITSx hardware optimized procedure of the JBIG CLEARBITS procedure.

DETAILED DESCRIPTION OF ILLUSTRATED EMBODIMENT

Figure 1:
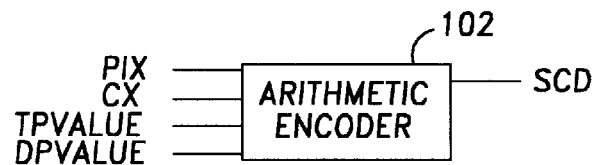
FIG. 1 is a block diagram illustrating the inputs and output of an arithmetic encoder of the present invention.

Illustrated in FIG. 1 is a block diagram showing the inputs and outputs of an arithmetic encoder 102 of the present invention. The arithmetic encoder 102 is an entropy coder that employs an adaptive arithmetic compression algorithm to encode symbols. An entropy encoder may utilize a lossless or lossy method for compressing data (for more information on entropy coding concepts, see Pennebaker, W. B., *JPEG: Still Image Data Compression Standard*, pp. 135–147 (1993)). In the case of arithmetic encoder 102, the method for the compression of data is an adaptive arithmetic algorithm which employs observed data characteristics to predict and code future data symbols. The arithmetic encoder 102 has a pixel input PIX, a context input CX, a typical prediction value input TPVALUE and a deterministic prediction value input DPVALUE. A pixel is one picture element of an image which is generally described by a rectangular array of such picture elements. A context CX is an integer corresponding to a specific pattern of a template and spatial phase (if required) that is used to identify the index of the state of the adaptive arithmetic coder to be used for coding the current pixel. A template is a geometric pattern describing the location of pixels relative to a pixel to be coded. It is generally used to model local image characteristics. Moreover, templates are typically employed in sequential behavior encoding and in multi-resolution layer encoding. Sequential behavior decoding is a decoding technique that shows the top of an image at final quality before lower portions of the same image have been decompressed. Multi-resolution layer decoding is a technique whereby an image is described as multiple resolution images (i.e. ranging from low resolution to high resolution). The lower resolution images are completely decompressed before higher resolution images, which reference the lower resolution images (for the case of a single stripe image). Sequential behavior decoding and multi-layer resolution decoding are well-known in the art and more information may be found in the JBIG Standard ISO/IEC 11544:1993(E).

A typical prediction value TPVALUE is a value used for exactly predicting pixels in an image by exploiting large regions of consistent color. A deterministic prediction value DPVALUE is a value for exactly predicting individual pixels in an image by using a lower resolution version of the same image, along with very specific knowledge of the method of resolution reduction used. The arithmetic encoder 102 has a stripe coded data output SCD. A stripe is a fixed vertical size region of an image that encompasses the entire horizontal width of that image. Accordingly, each input to arithmetic encoder 102 provides one value for each pixel in the stripe being coded. A detailed discussion of the adaptive arithmetic compression mechanism of the arithmetic encoder 102 shall be presented in the discussion accompanying FIGS. 4–14.

Figure 2:
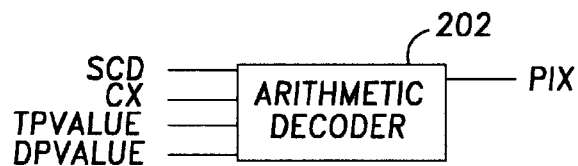
FIG. 2 is a block diagram illustrating the inputs and output of an arithmetic decoder of the present invention.

Referring now to FIG. 2, a block diagram illustrating the inputs and outputs of an arithmetic decoder 202 is shown.

The arithmetic decoder 202 has a stripe coded data input SCD, a context input CX, a typical prediction value input TPVALUE and a deterministic prediction value input DPVALUE. The arithmetic decoder 202 has a pixel output PIX. For each stripe of each resolution layer, the arithmetic decoder 202 reads a SCD byte stream. As each set of inputs CX, TPVALUE and DPVALUE is processed, a pixel value output PIX is generated. The inputs CX, TPVALUE and DPVALUE are identical to those used in the arithmetic encoder 102 of FIG. 1.

Figure 3:
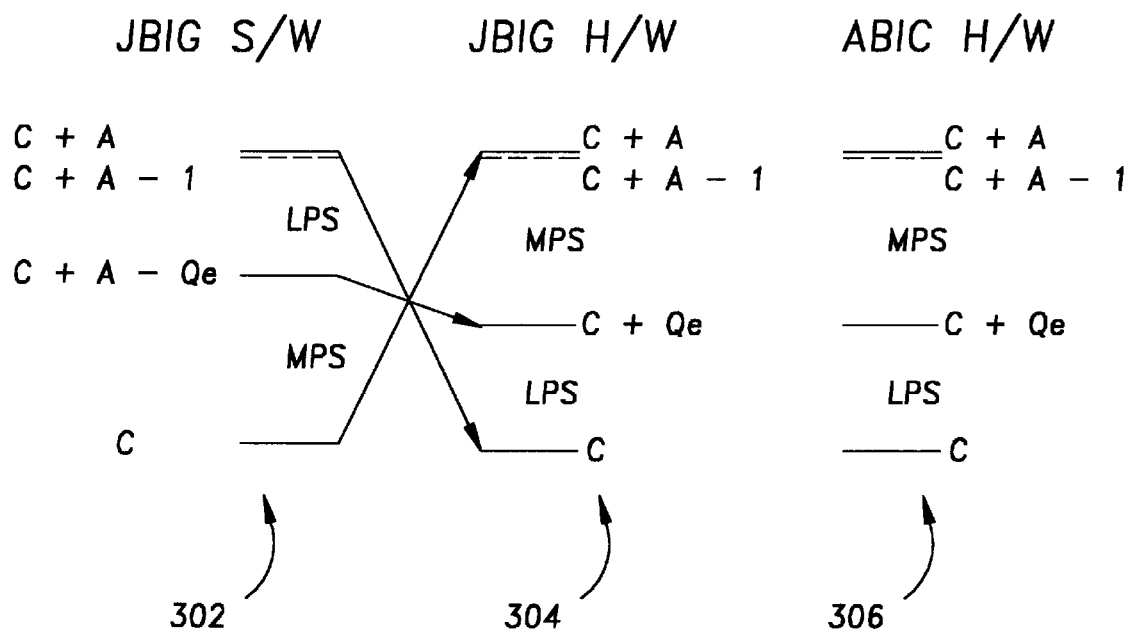
FIG. 3 is a graphical illustration of the hardware and software conventions of the JBIG International Standard and the ABIC IBM standard.

Shown in FIG. 3 is a graphical illustration of the various hardware and software conventions of the JBIG International Standard (QM-Coder) and the IBM ABIC standard (Q-Coder). In the JBIG International Standard and the IBM ABIC standard, the variable A stands for an interval and the variable C stands for a code stream pointer. Later, it will be noted that the variables A and C also refer to an interval size register and a code register respectively.

Shown in Tables 1 and 2 are the code register C and the interval size register A bit assignments for encoders of the JBIG Standard and IBM's ABIC standard, respectively. In Tables 1 and 2, and hereinafter, "msb" means a most significant bit and "lsb" means a least significant bit. In each standard, the "b" bits indicate the complete byte of data to be removed from the code register C to the BUFFER memory, the "s" bits are spacer bits and at least one is needed to constrain carry-over, the "a" bits are fractional bits representing the size of the current interval, the "x" bits are fractional bits in the code register and the "c" bit is a carry bit. In Table 1, the seventeenth "a" bit of the interval size register A is conceptually present and used only when initializing the A register to the maximum size of the interval 0x10000, where "0x" denotes a hexadecimal integer. As noted in the JBIG Standard, (subclause) 6.8.2.9, the A register can be initialized to 0x0000 for 16 bit implementations as long as the answer is the same for subtracting a 16-bit quantity from zero as is obtained from subtracting a 17-bit quantity from 0x10000.

TABLE 1

JBIG QM-Coder Register Assignments

| | msb | | | lsb |
|---|---|---|---|---|
| C register | 0000cbbb, | bbbbbsss, | xxxxxxxx, | xxxxxxx |
| A register | 00000000, | 0000000a, | aaaaaaaa, | aaaaaaaa |

TABLE 2

IBM ABIC Q-Coder Register Assignments

| | msb | | | lsb |
|---|---|---|---|---|
| C register | 0000000c, | bbbbbbbb, | ssssxxxx, | xxxxxxxx |
| A register | 00000000, | 00000000, | 0001aaaa, | aaaaaaaa |

In the JBIG Standard, the variable A includes the size of the current coding interval normalized to lie in the range of 0x8000 to 0x10000 (i.e. 0.75 to 1.5). Whenever, as a result of coding a symbol, the interval size A temporarily falls below 0x8000 (0.75), it is doubled until it is greater than or equal to 0x8000 (0.75). These doublings are termed "renormalizations." As the interval size register A is renormalized, the code register C is also shifted.

In the JBIG Standard, the QM-Coder is initialized with A=0x10000 (1.5) and C=0. Since the arithmetic encoder partitions a current interval into two intervals, the subinterval for a less probable symbol (LPS) is ordered above the subinterval for a more probable symbol (MPS) (shown at 302 of FIG. 3). The size of each subinterval is approximately proportional to the relative probabilities of symbol value occurrences. Therefore, for an LPS, the interval A equals the LPS probability and the code stream pointer C=C+A−Qe. The boundary C+A−Qe falls within the LPS in 302 and within the MPS in 304. For an MPS, the code stream pointer C remains unchanged (i.e. C=C), and the interval A=A−Qe. These conventions are shown at 302 in FIG. 3.

Still referring to FIG. 3, the hardware conventions for IBM's ABIC Q-Coder are shown at 306. In particular, for an LPS, the code stream pointer C=C and the interval A equals the probability estimate Qe of the LPS. For an MPS, the code stream pointer C=C+Qe, and the interval A=A−Qe. The boundary C+Qe falls within the MPS for 306. It should be noted that the JBIG software convention shown at 302 and the ABIC hardware convention shown at 306 are opposite each other. Shown at 304 is a JBIG hardware convention of the present invention that illustrates that an inversion procedure may be applied to the JBIG software convention to arrive at the JBIG hardware convention of the present invention shown at 304.

Figure 4:
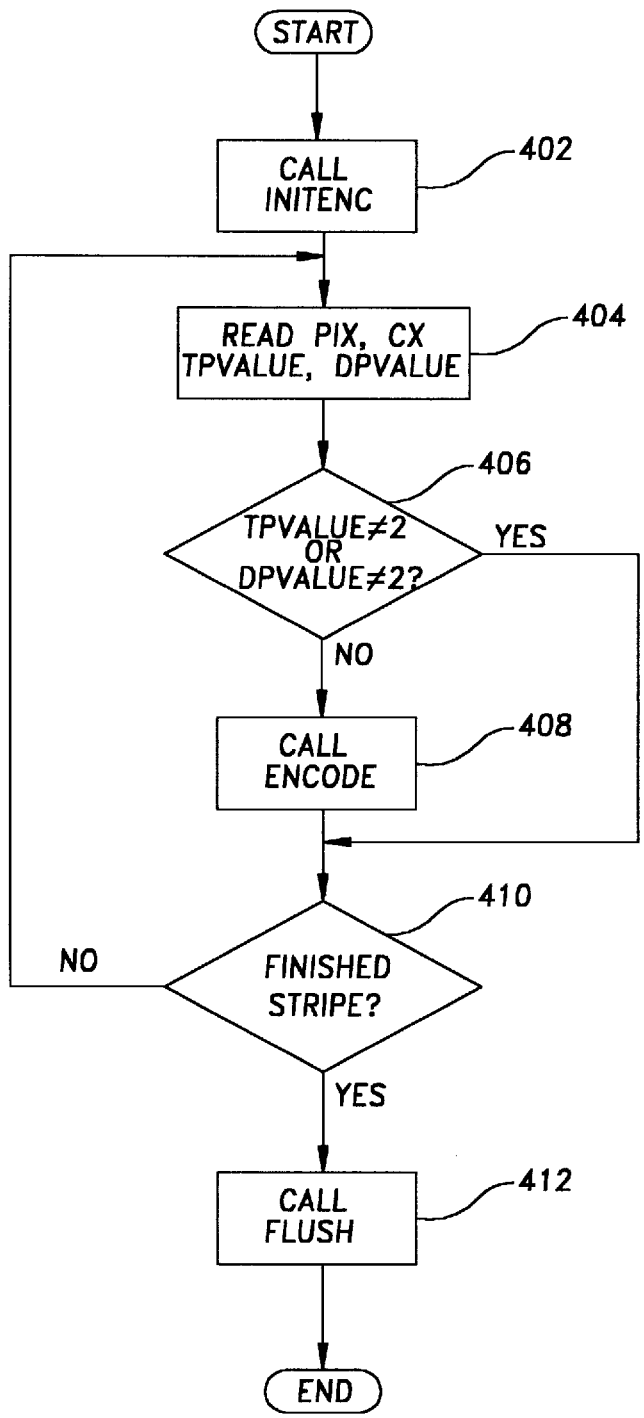

Referring now to FIG. 4, a JBIG encoder following the hardware conventions of the present invention is shown illustrating the steps executed by the encoder for each stripe of each resolution layer of an image. The encoder first calls, in step 402, a procedure INITENC to initialize the encoder. The encoder next moves to step 404 where a pixel value (PIX), a context value (CX), a typical prediction value (TPVALUE) and a deterministic prediction value (DPVALUE) are read. In step 406, the encoder checks to see if either of the TPVALUE or the DPVALUE are not equal to 2, indicating that the deterministic prediction or the typical prediction functions are enabled. If either the TPVALUE or the DPVALUE is not equal to 2, then the encoder proceeds to step 410. However, if both the TPVALUE and the DPVALUE are equal to 2, the encoder calls procedure ENCODE in step 408. The procedure ENCODE in step 408 will code either an MPS or an LPS. After step 408, the encoder will proceed to step 410, where a determination is made if the encoding of a complete stripe has been performed. If a complete stripe has been encoded, the encoder will call procedure FLUSH. Otherwise, the encoder will jump back to step 404 and read new PIX, CX, TPVALUE and DPVALUE. Having discussed the overview of the encoder flow diagram, the present discussion will now focus on the individual procedures called by the encoder flow diagram.

Procedure INITENC

Figure 5:
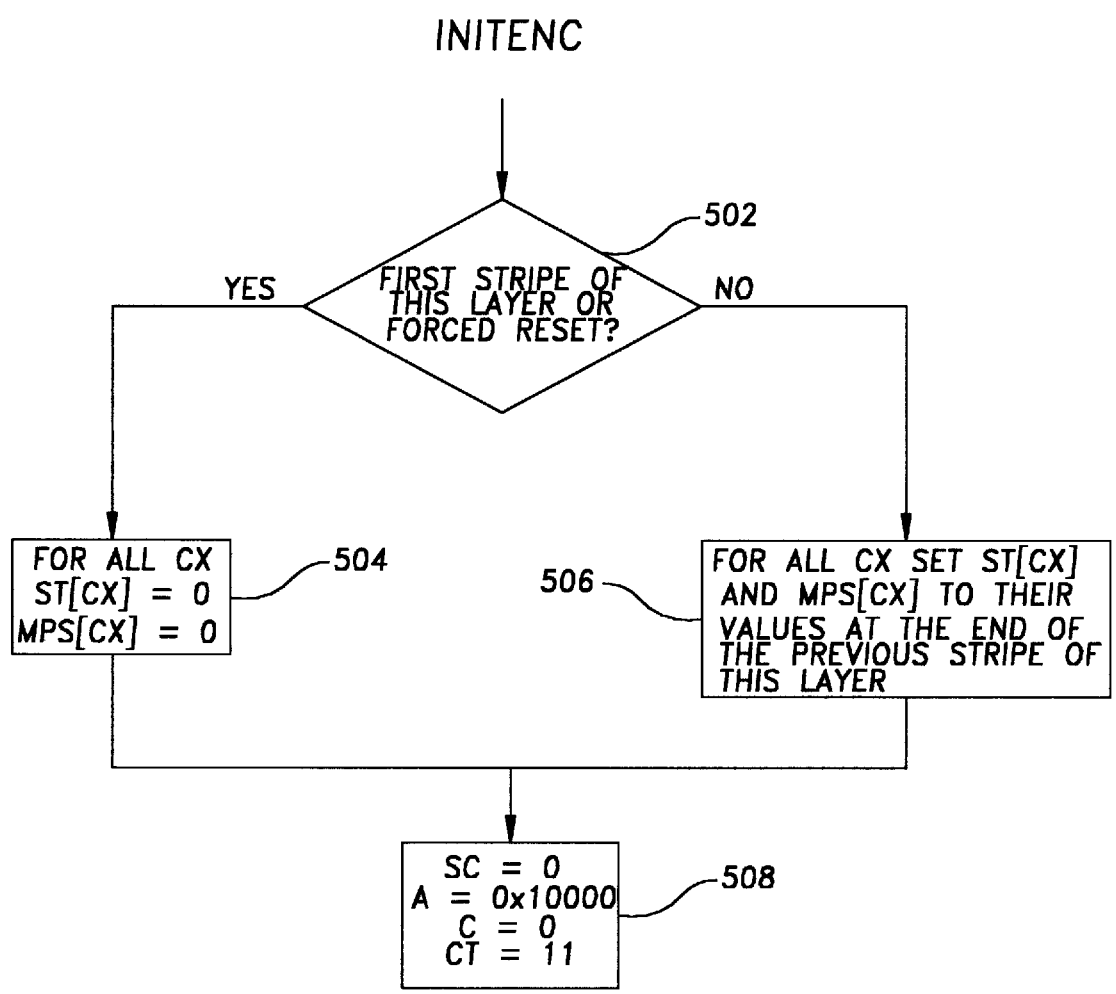

Illustrated in FIG. 5 is the procedure INITENC called by the encoder in step 402 of FIG. 4. In step 502, a decision is made as to whether the current stripe is at the top of an image. In particular, if the current stripe is at the top of the image, the encoder proceeds to step 504 where the probability estimation states for all possible values of the context CX are set to 0, that is, the state of each context CX (ST[CX]) is set equal to 0 and the more probable symbol for each context (MPS[CX]) is set equal to 0. If the current stripe is not the first stripe of the image or a reset is not forced, the encoder proceeds to step 506. In step 506, all state (ST) and MPS values for each context CX are reset to their values at the end of the last stripe at this resolution. After either step 504 or 506, the encoder proceeds to step 508. In step 508, the stack count SC and the code register C are cleared. The counter CT is set to 11 (a byte plus 3 spacer bits), and the coding interval size register A is set to 0x10000. Therefore, in step 508, the code register C is set to the bottom of the interval (i.e. 0), and the interval size register A is set to the maximum size of the interval (i.e. 0x10000).

Procedure ENCODE

Figure 6:
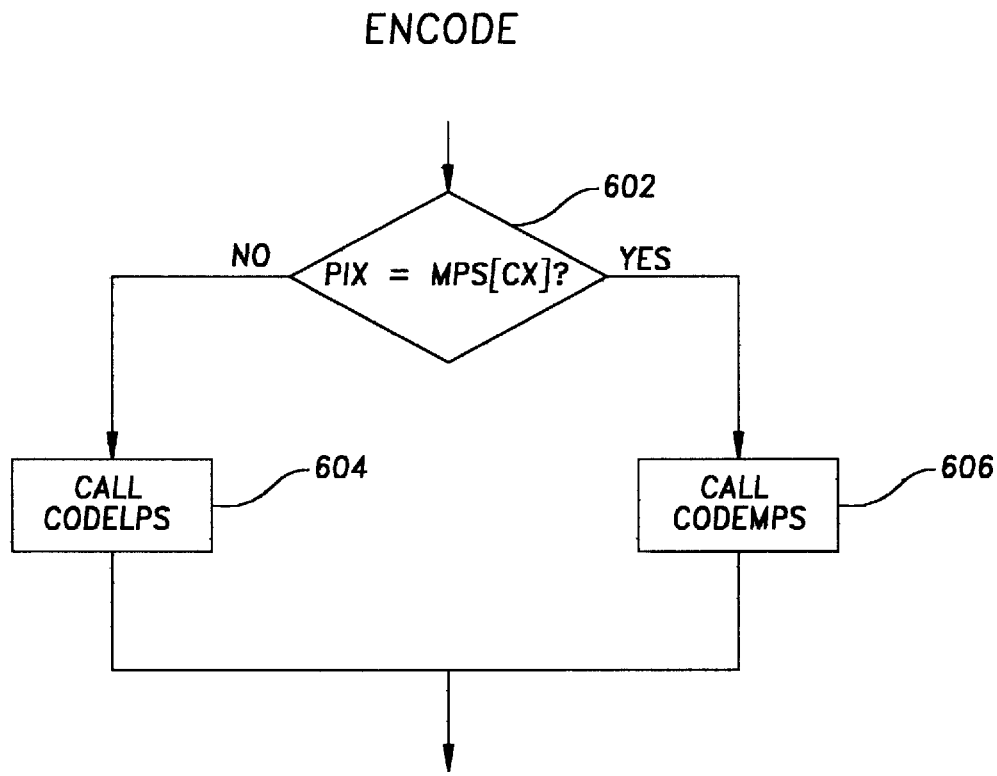

Illustrated in FIG. 6 is the procedure ENCODE. In step 602, the current symbol PIX is tested to see if it equals the value currently thought to be more probable (i.e. MPS[CX]). If PIX equals the value currently thought to be more probable, the encoder proceeds to step 606 and calls procedure CODEMPS. If, however, PIX does not equal the value thought to be more probable, the encoder proceeds to step 604 and calls procedure CODELPS.

Procedure CODELPS

Figure 7:
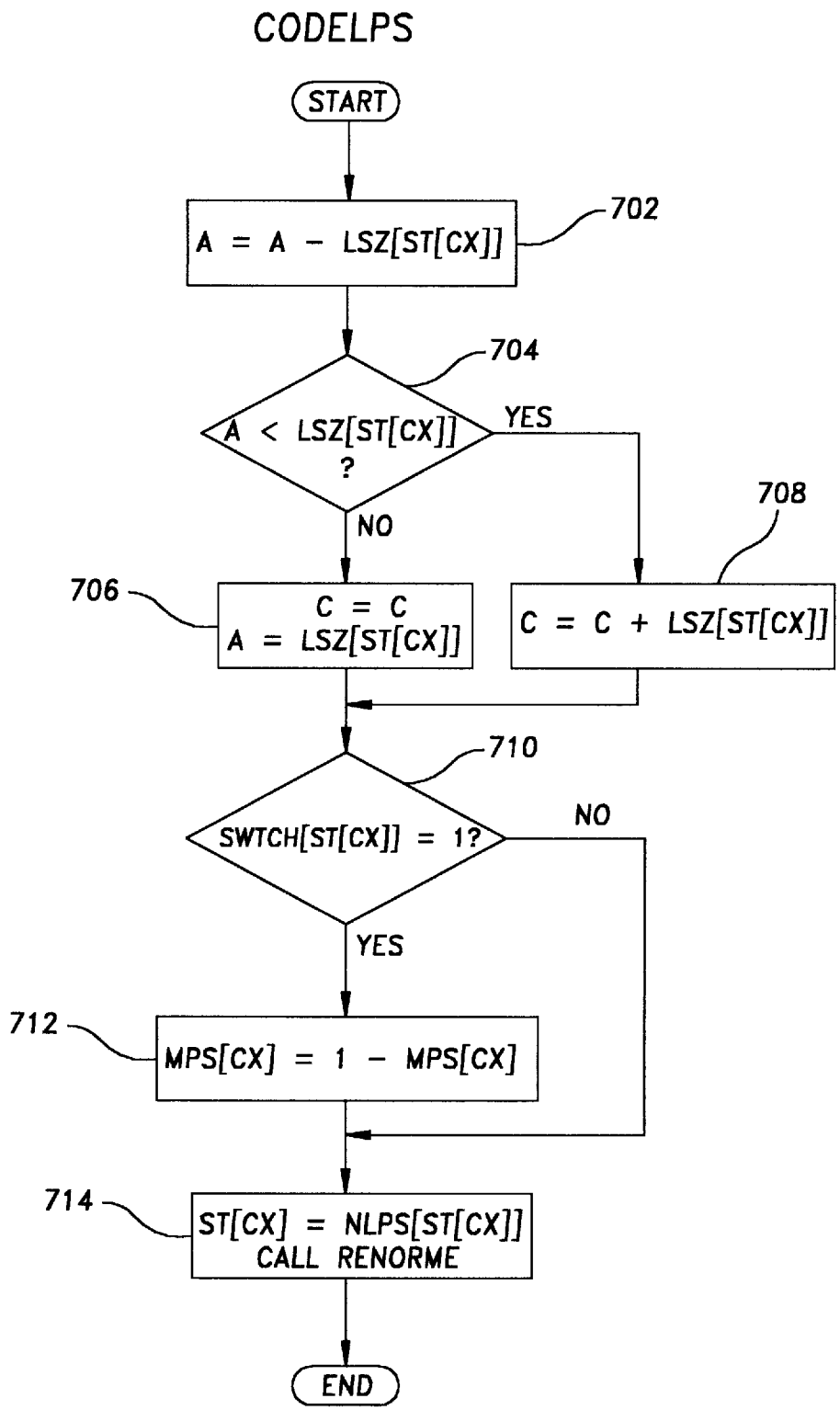

Illustrated in FIG. 7 is the CODELPS procedure. Before further discussing the CODELPS procedure, a discussion of the variables and their meanings that appear in the procedure CODELPS and the remaining procedures to be discussed is necessary. For each possible value of the context CX, a 1-bit value more probable symbol MPS[CX] and a 7-bit state value ST[CX] are utilized to identify the adaptive probability estimate associated with that particular context CX. The MPS[CX] is a more probable color for the pixel PIX. The variable LSZ is the probability estimate, which was previously denoted by the ABIC Q-Coder convention as Qe. The variables NLPS and NMPS are, respectively, the next probability estimation state for an LPS and an MPS. For each possible context CX, the variables LSZ, NLPS, NMPS and SWTCH are defined in a probability estimation table shown excerpted from the JBIG Standard and shown in Table 3. A complete table is shown p. 31 of the JBIG Standard. Therefore, for each ST[CX] value, the encoder can look up LSZ, NLPS, NMPS and SWTCH values.

TABLE 3

JBIG Probability Estimation Table

| ST | LSZ | NLPS | NMPS | SWTCH |
|---|---|---|---|---|
| 0 | 0x5a1d | 1 | 1 | 1 |
| 1 | 0x2586 | 14 | 2 | 0 |
| 2 | 0x1114 | 16 | 3 | 0 |
| 3 | 0x080b | 18 | 4 | 0 |
| 4 | 0x03d8 | 20 | 5 | 0 |
| 5 | 0x01da | 23 | 6 | 0 |
| 6 | 0x00e5 | 25 | 7 | 0 |
| 7 | 0x006f | 28 | 8 | 0 |
| 8 | 0x0036 | 30 | 9 | 0 |
| 9 | 0x001a | 33 | 10 | 0 |
| 10 | 0x000d | 35 | 11 | 0 |
| 11 | 0x0006 | 9 | 12 | 0 |
| 12 | 0x0003 | 10 | 13 | 0 |
| 13 | 0x0001 | 12 | 13 | 0 |
| 14 | 0x5a7f | 15 | 15 | 1 |
| 15 | 0x3f25 | 36 | 16 | 0 |
| 16 | 0x2cf2 | 38 | 17 | 0 |
| 17 | 0x207c | 39 | 18 | 0 |
| 18 | 0x17b9 | 40 | 19 | 0 |
| 19 | 0x1182 | 42 | 20 | 0 |
| 20 | 0x0cef | 43 | 21 | 0 |
| 21 | 0x09a1 | 45 | 22 | 0 |
| 22 | 0x072f | 46 | 23 | 0 |
| 23 | 0x055c | 48 | 24 | 0 |
| 24 | 0x0406 | 49 | 25 | 0 |
| 25 | 0x0303 | 51 | 26 | 0 |
| 26 | 0x0240 | 52 | 27 | 0 |
| 27 | 0x01b1 | 54 | 28 | 0 |
| 28 | 0x0144 | 56 | 29 | 0 |
| 29 | 0x00f5 | 57 | 30 | 0 |
| 30 | 0x00b7 | 59 | 31 | 0 |
| 31 | 0x008a | 60 | 32 | 0 |
| 32 | 0x0068 | 62 | 33 | 0 |

TABLE 3-continued

JBIG Probability Estimation Table

| ST | LSZ | NLPS | NMPS | SWTCH |
|---|---|---|---|---|
| 33 | 0x004e | 63 | 34 | 0 |
| 34 | 0x003b | 32 | 35 | 0 |
| 35 | 0x002c | 33 | 9 | 0 |
| 36 | 0x5ae1 | 37 | 37 | 1 |
| 37 | 0x484c | 64 | 38 | 0 |
| 38 | 0x3a0d | 65 | 39 | 0 |
| 39 | 0x2ef1 | 67 | 40 | 0 |
| 40 | 0x261f | 68 | 41 | 0 |
| 41 | 0x1f33 | 69 | 42 | 0 |
| 42 | 0x19a8 | 70 | 43 | 0 |
| 43 | 0x1518 | 72 | 44 | 0 |
| 44 | 0x1177 | 73 | 45 | 0 |
| 45 | 0x0e74 | 74 | 46 | 0 |
| 46 | 0x0bfb | 75 | 47 | 0 |
| 47 | 0x09f8 | 77 | 48 | 0 |
| 48 | 0x0861 | 78 | 49 | 0 |
| 49 | 0x0706 | 79 | 50 | 0 |
| 50 | 0x05cd | 48 | 51 | 0 |
| 51 | 0x04de | 50 | 52 | 0 |
| 52 | 0x040f | 50 | 53 | 0 |
| 53 | 0x0363 | 51 | 54 | 0 |
| 54 | 0x02d4 | 52 | 55 | 0 |
| 55 | 0x025c | 53 | 56 | 0 |
| 56 | 0x01f8 | 54 | 57 | 0 |
| 57 | 0x01a4 | 55 | 58 | 0 |
| 58 | 0x0160 | 56 | 59 | 0 |
| 59 | 0x0125 | 57 | 60 | 0 |
| 60 | 0x00f6 | 58 | 61 | 0 |
| 61 | 0x00cb | 59 | 62 | 0 |
| 62 | 0x00ab | 61 | 63 | 0 |
| 63 | 0x008f | 61 | 32 | 0 |
| 64 | 0x5b12 | 65 | 65 | 1 |
| 65 | 0x4d04 | 80 | 66 | 0 |
| 66 | 0x412c | 81 | 67 | 0 |
| 67 | 0x37d8 | 82 | 68 | 0 |
| 68 | 0x2fe8 | 83 | 69 | 0 |
| 69 | 0x293c | 84 | 70 | 0 |
| 70 | 0x2379 | 86 | 71 | 0 |
| 71 | 0x1edf | 87 | 72 | 0 |
| 72 | 0x1aa9 | 87 | 73 | 0 |
| 73 | 0x174e | 72 | 74 | 0 |
| 74 | 0x1424 | 72 | 75 | 0 |
| 75 | 0x119c | 74 | 76 | 0 |
| 76 | 0x0f6b | 74 | 77 | 0 |
| 77 | 0x0d51 | 75 | 78 | 0 |
| 78 | 0x0bb6 | 77 | 79 | 0 |
| 79 | 0x0a40 | 77 | 48 | 0 |
| 80 | 0x5832 | 80 | 81 | 1 |
| 81 | 0x4d1c | 88 | 82 | 0 |
| 82 | 0x438e | 89 | 83 | 0 |
| 83 | 0x3bdd | 90 | 84 | 0 |
| 84 | 0x34ee | 91 | 85 | 0 |
| 85 | 0x2eae | 92 | 86 | 0 |
| 86 | 0x299a | 93 | 87 | 0 |
| 87 | 0x2516 | 86 | 71 | 0 |
| 88 | 0x5570 | 88 | 89 | 1 |
| 89 | 0x4ca9 | 95 | 90 | 0 |
| 90 | 0x44d9 | 96 | 91 | 0 |
| 91 | 0x3e22 | 97 | 92 | 0 |
| 92 | 0x3824 | 99 | 93 | 0 |
| 93 | 0x32b4 | 99 | 94 | 0 |
| 94 | 0x2e17 | 93 | 86 | 0 |
| 95 | 0x56a8 | 95 | 96 | 1 |
| 96 | 0x4f46 | 101 | 97 | 0 |
| 97 | 0x47e5 | 102 | 98 | 0 |
| 98 | 0x41cf | 103 | 99 | 0 |
| 99 | 0x3c3d | 104 | 100 | 0 |
| 100 | 0x375e | 99 | 93 | 0 |
| 101 | 0x5231 | 105 | 102 | 0 |
| 102 | 0x4c0f | 106 | 103 | 0 |
| 103 | 0x4639 | 107 | 104 | 0 |
| 104 | 0x415e | 103 | 99 | 0 |
| 105 | 0x5627 | 105 | 106 | 1 |
| 106 | 0x50e7 | 108 | 107 | 0 |
| 107 | 0x4b85 | 109 | 103 | 0 |

TABLE 3-continued

JBIG Probability Estimation Table

| ST | LSZ | NLPS | NMPS | SWTCH |
|---|---|---|---|---|
| 108 | 0x5597 | 110 | 109 | 0 |
| 109 | 0x504f | 111 | 107 | 0 |
| 110 | 0x5a10 | 110 | 111 | 1 |
| 111 | 0x5522 | 112 | 109 | 0 |
| 112 | 0x59eb | 112 | 111 | 1 |

Still referring to FIG. 7, the procedure CODELPS starts at step 702 where the interval A is adjusted by subtracting the probability estimate LSZ[ST[CX]] from the interval size register A. In step 704, the CODELPS procedure tests the adjusted interval A to determine whether it is less than the probability estimate LSZ[ST[CX]]. If the interval A is less than the probability estimate LSZ[ST[CX]], then a conditional exchange is required and the procedure CODELPS proceeds to step 708. In step 708, the code register C is adjusted by adding to it the probability estimate LSZ[ST[CX]]. If a conditional exchange is not required, then the procedure CODELPS proceeds to step 706. In step 706, the code register value C is not modified, but the interval A is set equal to the probability estimate value LSZ[ST[CX]]. The procedure CODELPS then proceeds to step 710 where the SWTCH variable for a given context CX is tested to determine whether it is equal to 1. The SWTCH variable is used to determine whether the 1-bit MPS[CX] value must be inverted. If SWTCH for the given context CX equals 1, then the procedure CODELPS proceeds to step 712. In step 712, the 1-bit value MPS[CX] is inverted by a subtraction operation (i.e. MPS[CX]=1-MPS[CX]). However, if SWTCH does not equal 1, the procedure CODELPS proceeds to step 714. In step 714, the state of the current context ST[CX] is set to the next probability estimation state for the observed LPS (i.e. ST[CX]=NLPS[ST[CX]]). After the state of the current context CX is updated, the procedure CODELPS calls the procedure RENORME. The procedure RENORME will hereinafter be discussed in more detail with the text associated with FIG. 9.

Procedure CODEMPS

Figure 8:
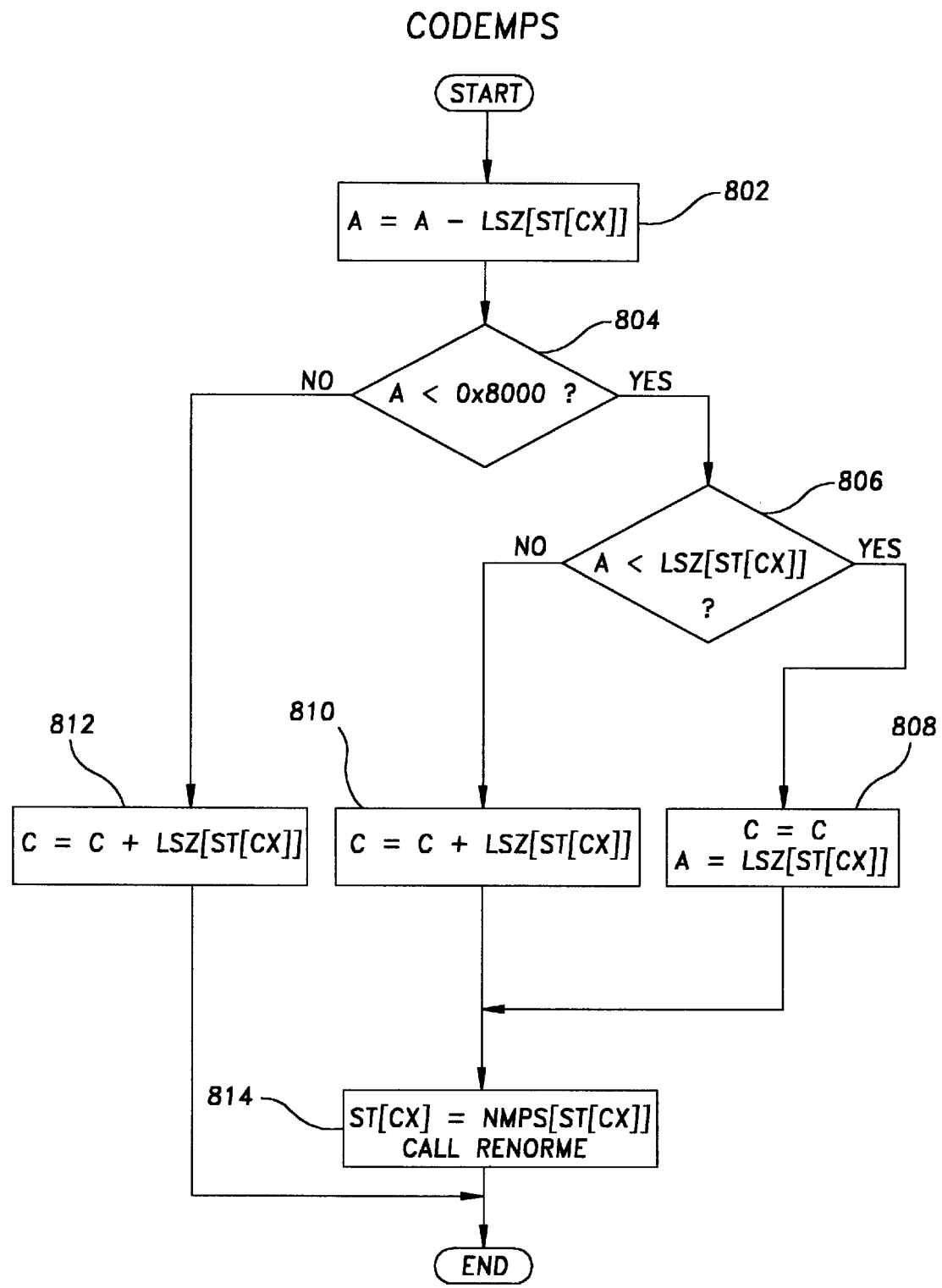

Referring now to FIG. 8, a flowchart for the procedure CODEMPS is shown. The procedure CODEMPS starts at step 802 where the interval A is adjusted by subtracting the probability estimate LSZ[ST[CX]] from the interval A. The procedure CODEMPS then proceeds to step 804 where the interval A is tested to determine whether a renormalization is required by ascertaining whether the interval A is less than 0x8000. If the interval A is less than 0x8000, the procedure CODEMPS proceeds to step 806. In step 806, the interval A is tested to further determine whether a conditional exchange is required by ascertaining whether the interval A is less than the probability estimate LSZ[ST[CX]]. If the interval A is less than the probability estimate LSZ[ST[CX]], then CODEMPS proceeds to step 808. In step 808, the code register C is not modified, however, the interval A is adjusted so that it equals the probability estimate LSZ[ST[CX]]. If the interval A is not less than the probability estimate LSZ[ST[CX]] in step 806, the procedure CODEMPS proceeds to step 810. In step 810, the code register C is adjusted by adding the probability estimate LSZ[ST[CX]] to the code register C. In step 814, the state of the current context ST[CX] is set equal to the next probability estimation state for the observed MPS (i.e. NMPS[ST[CX]]). Lastly, in step 814, the procedure CODEMPS calls the procedure RENORME. As noted earlier, a detailed discussion of the procedure RENORME accompanies the discussion associated with FIG. 9. If, in step 804, the interval A is not less than 0x8000, thereby indicating that the interval A is at or above the lower boundary of 0x8000, the procedure CODEMPS proceeds to step 812. In step 812, the code register C is adjusted by adding the probability estimation value LSZ[ST[CX]] to the code register C.

Procedure RENORME

Figure 9:
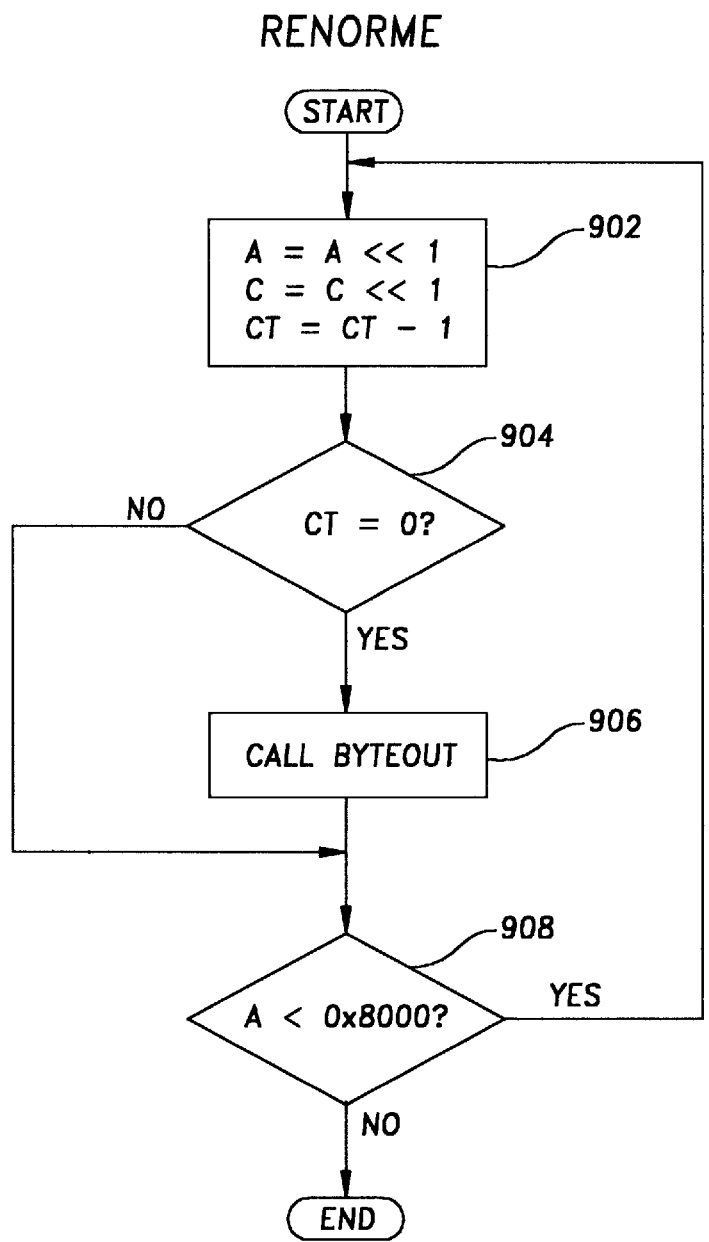

Illustrated in FIG. 9 is a flowchart showing the RENORME procedure. The RENORME procedure starts at step 902 where both the interval size register A and the code register C are shifted one bit at a time to the left via a binary left shift operation (<<). The number of binary shifts that are performed are tracked by the counter CT. To recall, the INITENC procedure initialized the counter CT to a value of 11. Therefore, in step 902, the value of counter CT is decremented once each time a binary left shift operation is performed on the interval size register A and the code register C. The procedure RENORME then proceeds to step 904 where the counter CT is tested to determine whether it is equal to 0. If counter CT is equal to 0, the procedure RENORME proceeds to step 906 and calls a procedure BYTEOUT. The procedure BYTEOUT removes a byte of compressed data from the code register C. A detailed discussion of the procedure BYTEOUT is given in the text associated with FIG. 10. If, in step 904, the counter CT does not equal 0, the procedure RENORME proceeds to step 908. Step 908 tests the interval size register A to determine whether it is less than 0x8000 (i.e., below the lower boundary of the interval size register A). If the interval size register A is less than 0x8000, the procedure RENORME proceeds back to step 902 and continues to perform binary left shift operations on the interval size register A and the code register C. If the interval size register A is not less than 0x8000, the procedure RENORME ends.

Procedure BYTEOUT

Figure 10:
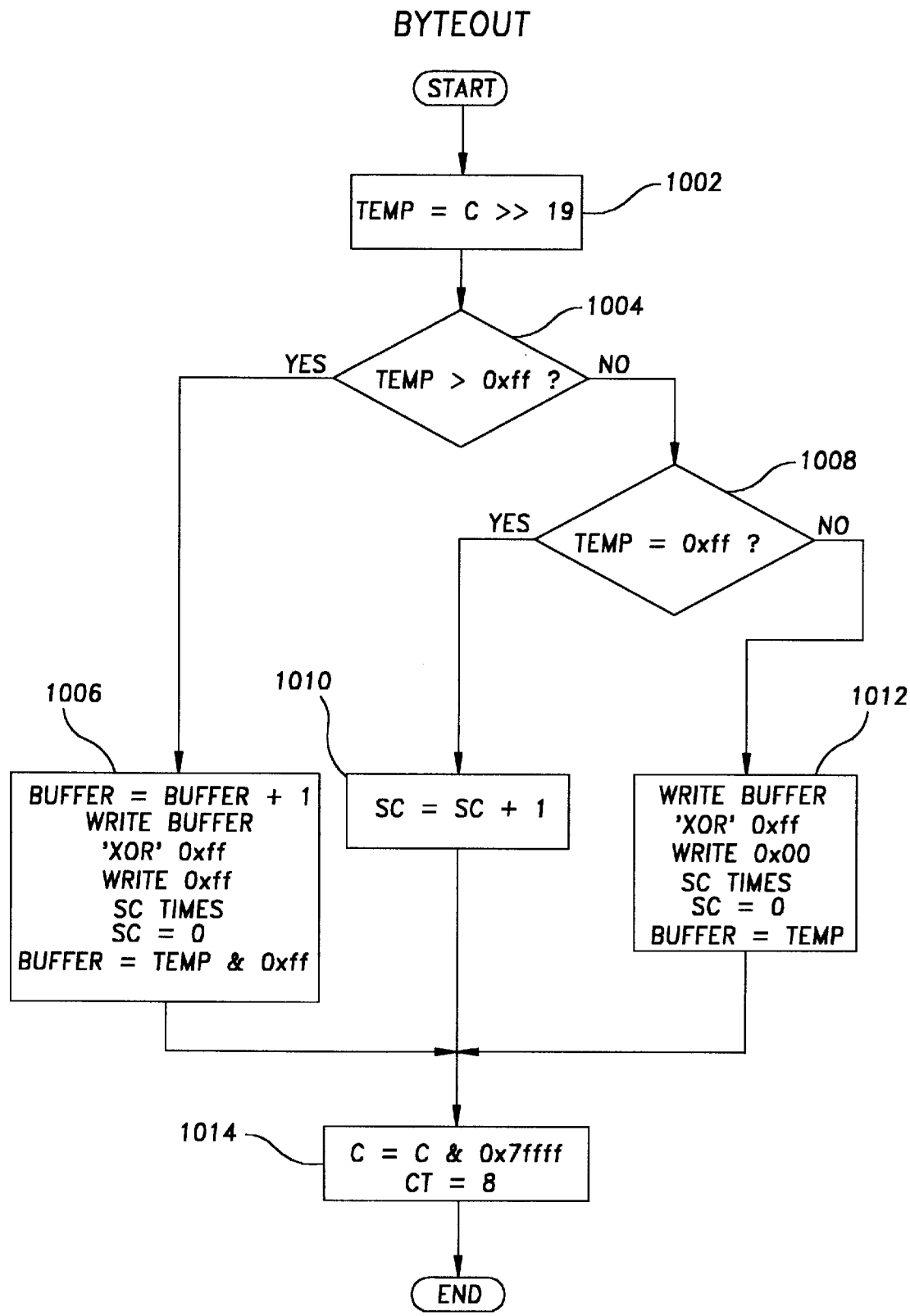

Illustrated in FIG. 10 is the procedure BYTEOUT. The procedure BYTEOUT is called from the procedure RENORME. The procedure BYTEOUT starts at step 1002 where a variable TEMP is set equal to the code register C contents binary right shifted by 19 bits. The shift of the code register C by 19 bits aligns the output bits "b" with the low order bits of TEMP. The variable TEMP holds the byte at the top of the code register C that is to be output, plus a carry indication. In step 1004, the variable TEMP is tested to determine whether it is greater than 0xff, that is, whether a carry needs to be resolved. If a carry has occurred, the procedure BYTEOUT proceeds to step 1006. In step 1006, a variable BUFFER holds the most recent tentative output that was not equal to 0xff. In step 1006, the value of BUFFER is incremented by one (i.e. the carry is added to BUFFER) and BUFFER is then exclusive ORed ('XOR') with 0xff causing BUFFER to be inverted and then written as an output. Moreover, in step 1006 the BYTEOUT procedure writes to the output buffer all the stacked 0xff bytes, that the carry converted to 0x00 bytes which the inversion procedure converts back to 0xff bytes. Also, in step 1006, the stack counter SC is reset to zero. Lastly, in step 1006, eight bits are assigned to BUFFER by ANDing TEMP with 0xff (i.e. BUFFER=TEMP & 0xff).

If a carry has not occurred, as determined by step 1004, the procedure BYTEOUT proceeds to step 1008. In step 1008, the variable TEMP is tested to determine whether it is equal to 0xff thereby indicating this byte should be stacked. Under this condition, that TEMP=0xff, the procedure BYTEOUT proceeds to step 1010. In step 1010, the 0xff bytes are counted or stacked by the stack counter SC by incrementing SC each time TEMP=0xff Under the condition that TEMP does not equal 0xff, in step 1008, the procedure BYTEOUT proceeds to step 1012. In step 1012, BUFFER is inverted by an exclusive OR ('XOR') operation with 0xff and written to the output buffer. Additionally, in step 1012, all of the stacked 0xff bytes are written SC times as 0x00 bytes (i.e. inverted 0xff) and the high order byte of the C register, i.e. TEMP, is assigned to BUFFER. Lastly, from either steps 1006, 1010 or 1012, the procedure BYTEOUT proceeds to step 1014. In step 1014, the C register's carry bit and output byte are cleared (i.e. C=C & 0x7ffff) and the counter CT is set to eight. The inversions performed in steps 1006 and 1012 are necessary so that a proper output is sent to the output buffer. A proper output is defined as output equivalence with the JBIG International Standard.

Procedure FLUSH

Referring now to FIG. 11, a flowchart illustrating the procedure FLUSH of the arithmetic encoder 102 is shown. The FLUSH procedure first calls a procedure known as CLEARBITSx to set the code register C to a value in the interval between C and C+A−1 that ends with the greatest possible number of 1 bits. The procedure FLUSH then calls on a procedure FINALWRITES. The procedure FINAL-WRITES performs the final carry resolution and writes two bytes from the code register to the stripe coded data SCD stream. The procedure FLUSH then removes the first byte that was written into the SCD stream and any 0x00 bytes at the end of the stripe coded data SCD stream are removed until a byte not equal to 0x00 is encountered. This procedure of removing all 0x00 bytes from the end of a stripe coded data SCD stream has been nicknamed "PACMAN" because the nibbling away of trailing 0x00's is similar to the popular computer game of that same name.

JBIG CLEARBITS Procedure

Referring now to FIGS. 3 and 12, a flowchart of the JBIG CLEARBITS procedure of the international published standard is shown in FIG. 12 and the software convention of the QM-Coder is shown in FIG. 3. The procedure CLEARBITS functions to set the code register C to a value in the interval between C and C+A−1 that ends with the greatest number of 0 bits. From FIG. 3 at 302, it can be seen that the top of the interval is C+A−1, and the bottom of the interval is C. In FIG. 12, the CLEARBITS procedure starts at step 1202 and sets a variable TEMP equal to the top of the interval (C+A−1) and clears the low order sixteen bits of TEMP by ANDing TEMP with 0xffff0000. In step 1204, the value of TEMP is compared to the bottom of the interval C. If TEMP is less than C, thereby indicating that TEMP is below the bottom of the interval, CLEARBITS proceeds to step 1208. In step 1208, CLEARBITS adds 0x8000 (i.e., adding a 1 to the sixteenth bit of TEMP) to bring TEMP back up to or above the bottom of the interval C and then sets C to that value (i.e. C=TEMP+0x8000). If, however, TEMP is not less than C, thereby indicating that TEMP is at or above the bottom of the interval C, CLEARBITS proceeds to step 1206. In step 1206, the code register C is set to TEMP since TEMP is already at or above the bottom of the interval and there is no need to adjust its value.

Hardware Implementation of JBIG CLEARBITS Procedure

Figure 15:
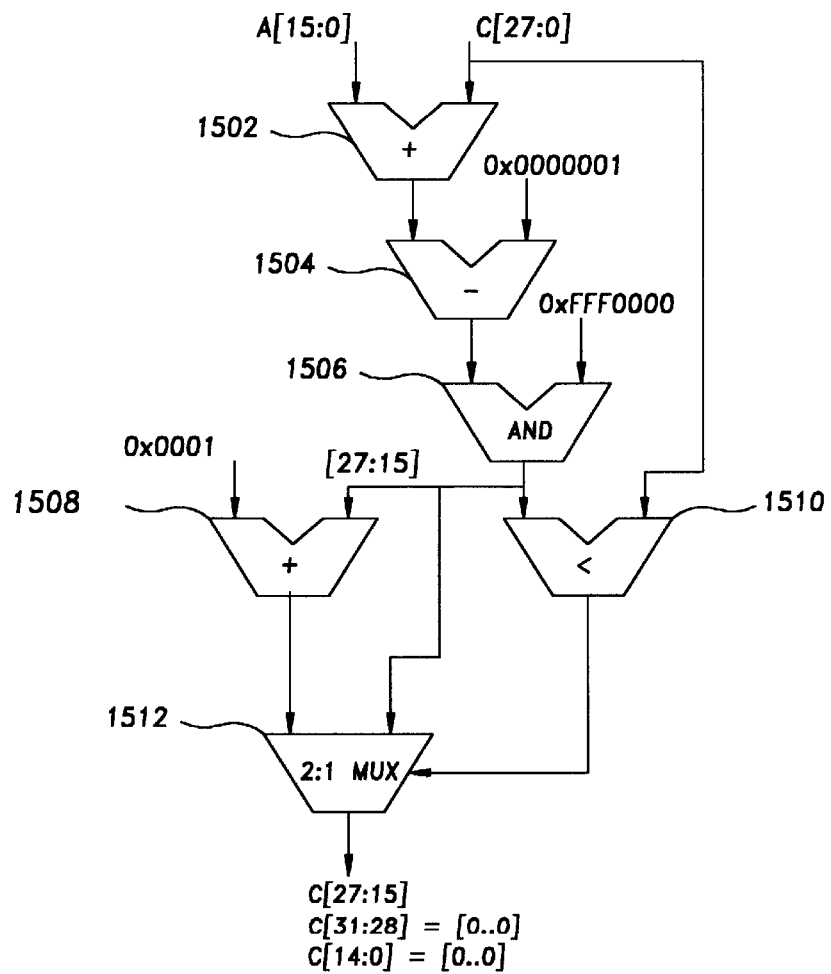
FIG. 15 is a schematic illustration of a hardware implementation of the JBIG CLEARBITS procedure shown in FIG. 12.

Referring now to FIG. 15, a schematic illustration of a hardware implementation of the JBIG CLEARBITS procedure of FIG. 12 is shown. The JBIG CLEARBITS hardware implementation includes arithmetic logic units 1502–1510 and a 2:1 multiplexer 1512. Arithmetic units 1502–1506 are required to perform step 1202 of FIG. 12. In particular, sixteen bits of the interval size register A (A[15:0]) are added to the twenty-eight bits of the code register C (C[27:0]) by arithmetic unit 1502. Arithmetic unit 1504 subtracts 1 from the output of arithmetic unit 1502. Arithmetic unit 1506 clears the low order sixteen bits by performing a logical AND operation on the output of arithmetic unit 1504 by ANDing it with 0xffff0000. The output of arithmetic unit 1506 represents step 1202 of FIG. 12, that is, TEMP=(A−1+C) & 0xffff0000. The output of arithmetic unit 1506 is then fed into arithmetic units 1508 and 1510. Arithmetic unit 1510 compares the output of arithmetic unit 1506 to the code register C to determine if the output of arithmetic unit 1506 is less than the code register C. Arithmetic unit 1510 performs the function of CLEARBITS procedure step 1204 of FIG. 12. Arithmetic unit 1508 adds 0x00001 to the output of arithmetic unit 1506 and outputs the results to multiplexer 1512. The multiplexer 1512 has as inputs the outputs of arithmetic unit 1506 and 1508 and has as a select input the output of arithmetic unit 1510. If the output of arithmetic unit 1510 indicates that the output of arithmetic unit 1506 (i.e., TEMP) is less than the code register C, the multiplexer will select the output of arithmetic unit 1508 to set the higher order bits of the code register C to the higher order bits of TEMP +0x0001. If the arithmetic unit 1510 indicates that the output of arithmetic unit 1506 (i.e. TEMP) is not less than the code register C, its output will cause multiplexer 1512 to select the output of arithmetic unit 1506 (i.e., TEMP) to set as the code register C value. The code register C value to be set by the output of multiplexer 1512 is bits 27 to 15 (C[27:15]). The remaining 15 bits of the code register C are set to 0 (C[14:0]=[0 . . . 0]). The four highest-order bits of the 32-bit register C[31:28] are set to zero (i.e. C[31:28]= [0 . . . 0]). Consequently, it can be seen that five arithmetic units and a multiplexer are required to perform the JBIG CLEARBITS procedure of FIG. 12.

CLEARBITSx Procedure

To recall, the JBIG Standard's CLEARBITS procedure functions to set the code register C to a value in the interval between C and C+A−1 that ends with the greatest number of 0 bits. Moreover, referring to FIG. 3, the JBIG Standard is defined in terms of software conventions 302 which are opposite in nature to that of the ABIC standard's hardware conventions 306. Also shown in FIG. 3 at 304, is the JBIG Standard hardware convention of the present invention which illustrates that an inversion procedure may be applied to the JBIG Standard's software convention that allows a hardware implementation of the JBIG Standard, which in turn, allows a shared hardware implementation with the ABIC standard. This inversion procedure is employed by the BYTEOUT procedure, in the case of the presently described JBIG encoder following the hardware conventions of the present invention, and by the BYTEOUTx procedure in the case of the Qx-Coder of the present invention, to be described infra. Once the greatest number of 1's are set in the code register C, then procedure FINALWRITES, or FINALWRITESx in the Qx-Coder described infra, inverts the result so that the greatest number of 0's are set and thus creates the same result as the JBIG Standard's software defined CLEARBITS. Accordingly, the hardware implementation of CLEARBITSx, described infra, seeks to set the code register C to a value with the greatest number of 1's that is in the interval.

Referring now to FIG. 13, a flowchart of the CLEAR-BITSx hardware optimized procedure of the present invention is shown. In step 1302, the CLEARBITSx procedure checks the sixteenth bit (C[15]) of the code register C to determine if it equals 0. If the sixteenth bit of the code register C equals 0, then the procedure CLEARBITSx proceeds to step 1304. In step 1304, the low order fifteen bits of the interval size register A are added to the low order sixteen bits of the code register C. If the sixteenth bit of the code register C (C[15]) does not equal 0, CLEARBITSx proceeds to step 1306. In step 1306, the low order fifteen bits of the code register C are set to "1" via an OR operation with 0x7fff.

Therefore, step 1302 determines if the sixteenth bit of the code register C is a "1." If the sixteenth bit of the code register C is a "1," step 1306 sets the low order 15 bits of the code register C to 0x7fff. If the sixteenth bit of the code register C is not a "1," the low order 15 bits of the interval register A are added to the low order 16 bits of the code register C. Depending upon the location of the interval base, as described by the code register C, and the size of the interval, as described by the interval size register A, the carry of this addition may set the sixteenth bit of the code register C. Step 1304 is followed by step 1306 where the low order 15 bits of the code register C are set to 0x7fff.

Hardware Implementation of CLEARBITSx Procedure

Figure 16:
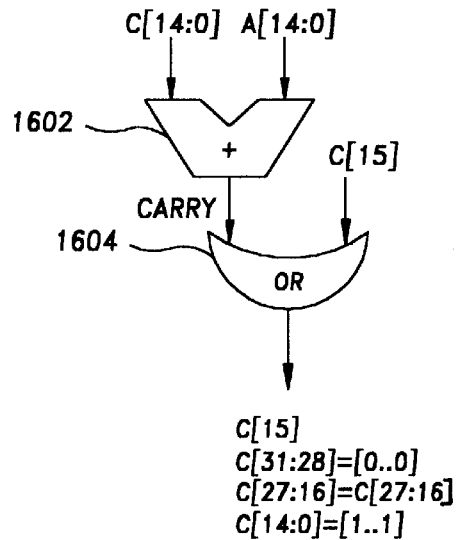
FIG. 16 is a schematic illustration of a hardware optimized CLEARBITSx procedure of the present invention shown in FIG. 13.

Referring now to FIG. 16, a schematic illustration of a hardware optimized CLEARBITSx procedure of the present invention is shown. The CLEARBITSx procedure includes arithmetic unit 1602 and OR gate 1604. Arithmetic unit 1602 has as inputs the low order fifteen bits of the code register C (C[14:0]) and the low order fifteen bits of the interval size register A (A[14:0]). The arithmetic unit 1602 adds the low order fifteen bits of the code register C and the interval size register A and outputs a carry bit, if occurring, into OR gate 1604. OR gate 1604 determines if the carry output of arithmetic unit 1602 or the sixteenth bit of the code register C (C[15]) is set (i.e., a "1"). If either input is set (i.e. "1"), the output of OR gate 1604 will set the sixteenth bit of the code register C (C[15]) to "1." The high order bits 27 to 16 of the code register C remain unchanged (C[27:16]=C[27:16]), while the high order bits 31 to 28 are set to zero (C[31:28]=[0 . . . 0]). The low order fifteen bits of the code register C are set to "1" (C[14:0=[1 . . . 1]). The hardware optimized implementation of the CLEARBITSx procedure employs only one arithmetic unit 1602 and an OR gate 1604 to set the code register C to a value within the interval C and C+A that ends with the most possible trailing 1's. These trailing 1's are inverted during the output of the two final bytes in the code register C during the procedure FINALWRITES, or FINALWRITESx in the case of the Qx-Coder, to match the JBIG Standard which creates trailing zero's.

Referring now to FIGS. 12, 13, 15 and 16, the CLEARBITSx procedure of the present invention provides for simpler hardware implementation and thereby quicker execution of the setting of the code register C than the JBIG CLEARBITS procedure published in International Standard ISO/IEC 11544. In particular, the CLEARBITSx procedure can be implemented with only one arithmetic unit and one OR gate. Conversely, the JBIG CLEARBITS procedure requires 5 arithmetic units (or operations) and a 2:1 multiplexer. Therefore, by employing less hardware than JBIG CLEARBITS procedure to accomplish the same result, the CLEARBITSx procedure provides for a shorter latency, or dormancy, period during the encoding process and simpler hardware implementation.

Procedure FINALWRITES

Figure 14:
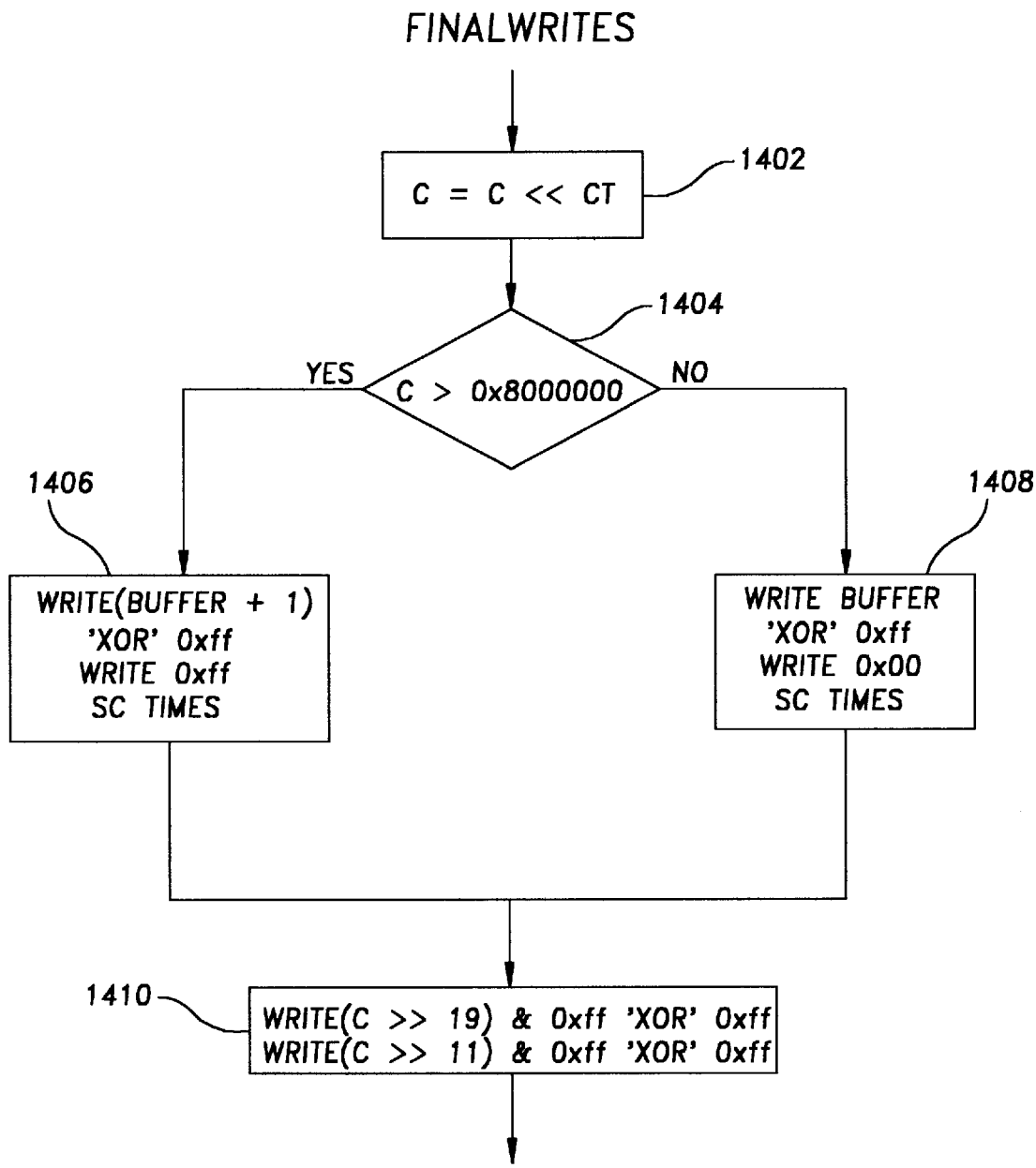

In procedure FINALWRITES, shown in FIG. 14, the final carry resolution is resolved and two bytes from the code register C are written to the output buffer. In particular, in step 1402, the code register is shifted logic left CT (i.e. counter value) times. The code register C is then tested, in step 1404, to determine whether it is greater than 0x8000000. If the code register C is greater than 0x8000000, then the procedure FINALWRITES proceeds to step 1406. In step 1406 the variable BUFFER is incremented by one and inverted via the 'XOR' operation before it is written to the output buffer. Also in step 1406, 0xff is written SC (i.e. stack counter) times. If the code register C is not greater than 0x8000000, then the procedure FINALWRITES proceeds to step 1408. In step 1408, the variable BUFFER is inverted via the 'XOR' operation with 0xff before it is written to the output buffer and 0x00 (i.e. inversion of 0xff) is written SC (i.e. stack counter) times to the output buffer. From either step 1406 or 1408, the procedure FINALWRITES proceeds to step 1410. In step 1410, two bytes from the code register C are output to the output buffer. In particular, the first byte output is the code register value C shifted logic right 19 bits ANDed with 0xff and inverted via 'XOR' 0xff. The second byte output from the code register is code register value C shifted logic right 11 bits ANDed with 0xff and inverted via 'XOR' 0xff. The inversion on the output is necessary so that compliance with the JBIG International Standard is achieved. Accordingly, the present invention shown in FIGS. 3–16, and the text associated therewith, defines the requirements necessary to implement the JBIG Standard in a hardware implementation that results in an output that is in compliance with the JBIG Standard.

The Qx-Coder

The present invention further provides a merged VLSI implementation of a hardware optimized Q-coder and software optimized QM-coder. The merged VLSI implementation will hereinafter be referred to as the Qx-Coder. Before describing the details of the Qx-Coder, a somewhat detailed examination of the differences between the JBIG QM-coder and the IBM Q-Coder will be presented. In particular, the differences and the solution provided by the Qx-Coder are shown in Table 4 and discussed in the following text.

TABLE 4

The QM-coder and Q-coder differences and Qx-Coder Solutions

| Q-Coder | QM-Coder | Solution: Qx-Coder |
|---|---|---|
| Hardware convention | Software convention | Convert Software convention to Hardware convention |
| LPS is located at bottom of interval | LPS is located at top of interval | LPS is usually at bottom of interval |
| 12-bit Qe values | 15-bit Qe values | Left justify 12-bit Qe values |
| 13-bit A register | 16-bit A register | 16-bit A register |
| 30 Qe values (5 bits/context) | 113 Qe values (7 bits/context) | Both at 7 bits/context |
| Describes 4 stuff bits | Describes 3 stuff bits | Same number when properly aligned |
| LPS/MPS boundary with MPS | LPS/MPS boundary with LPS | LPS/MPS boundary with MPS |
| ENCODER: | | |
| 25-bit C register | 28-bit C register | 28-bit C register (25 bit shifted left 3 bits) |
| Flush C register | Clear 15 or 16 bits | Both (See CLEARBITSx procedure, infra.) |
| Renormalization on A<0x1000 | Renormalization on A<0x8000 | Shift Q-Coder A register left 3 bits so renormalization on A<0x8000 for both |
| Initialize: A register = 0x1000 CT = 12 | Initialize: A register = 0x10000 CT = 11 | Both |

TABLE 4-continued

The QM-coder and Q-coder differences and Qx-Coder Solutions

| Q-Coder | QM-Coder | Solution: Qx-Coder |
|---|---|---|
| Bit stuffing | Byte stuffing | Both |
| Decoder resolves carry | Encoder resolves carry | Both |
| Compressed data | JBIG Standard compressed data | Both—Invert JBIG compressed data |
| None | Conditional exchange | Conditional exchange on QM-Coder only |
| DECODER: | | |
| Bit unstuffing | Byte unstuffing | Both |
| Compressed data | JBIG Standard compressed data | Both--Invert JBIG compressed data |
| C register equals 0 when done | Supply 0x00s when out of data | Both |
| Initialize: | | |
| A register = 0x1000 | A register = 0x10000 | Both |

The hardware optimized ABIC and the software optimized JBIG are merged into a common hardware-optimized structure. The ABIC 13 bit A register is located in the high order 13 bits of the 16 bit JBIG A register. Similarly, the ABIC C register is shifted left 3 bits in the JBIG C register. This configuration allows the output byte to be co-located in the hardware. The JBIG hardware optimized compressed data is inverted at the output to create the identical JBIG software-optimized compressed data. (See TABLES 1 and 2, supra, and TABLE 5). The Qx-Coder encoder flowcharts are illustrated in FIGS. 13, 16 and 17–25 and will hereinafter be referred to in detail.

TABLE 5

Qx-Coder Encoder Register Assignments for Q-Coder

| | msb | | | lsb |
|---|---|---|---|---|
| C register | 0000cbbb, | bbbbbsss, | sxxxxxxx, | xxxxx000 |
| A register | 00000000, | 00000000, | 1aaaaaaa, | aaaaa000 |

Qx-Coder ENCODER

Figure 17:
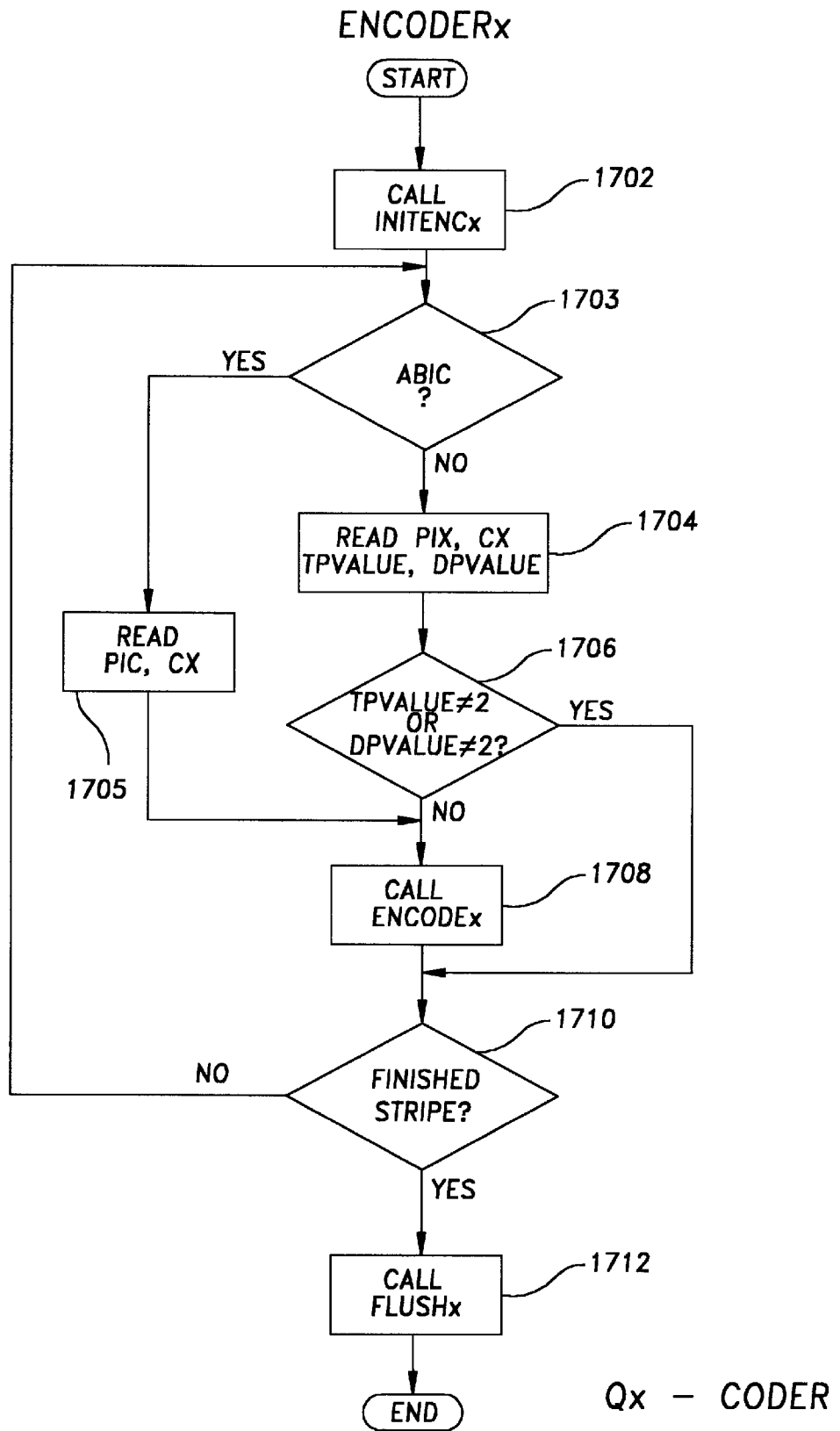
FIGS. 17–25 are flowcharts illustrating the Qx-Coder Encoder operation of the present invention employing shared hardware between the JBIG and ABIC compression standards.

Referring now to FIG. 17, the Qx-Coder encoder flow diagram is shown illustrating the steps executed by the encoder for each stripe of each resolution layer of an image. The Qx-Coder encoder flowchart shown in FIG. 17 is similar to the QM-Coder's encoder flowchart shown in FIG. 4. The encoder first calls, in step 1702, a procedure INITENCx to initialize the encoder. The encoder than proceeds to step 1703 where the standard status variable is tested to determine whether the JBIG Standard or the ABIC standard is being employed. If the ABIC standard is being employed, then the encoder proceeds to step 1705 where a pixel value PIX and a context CX are read. If the JBIG Standard is being employed, the encoder proceeds to step 1704. In step 1704, a pixel value (PIX), a context value (CX), a typical prediction value (TPVALUE) and a deterministic prediction value (DPVALUE) are read. In step 1706, the encoder checks to see if either of the TPVALUE or the DPVALUE is not equal to 2, indicating that the deterministic prediction or the typical prediction functions are enabled. If either the TPVALUE or the DPVALUE is not equal to 2, then the encoder proceeds to step 1710. However, if both the TPVALUE and the DPVALUE are equal to 2, the encoder calls procedure ENCODEx in step 1708. The procedure ENCODEx in step 1708 will code either an MPS or an LPS. After step 1708, the encoder will proceed to step 1710, where a determination is made if the encoding of a complete stripe has been performed. If a complete stripe has been encoded, the encoder will call procedure FLUSHx in step 1712. Otherwise, the encoder will jump back to step 1703 and once again test the standard status variable to determine whether the JBIG Standard or the ABIC standard is being utilized. Having discussed the overview of the Qx-Coder encoder flow diagram, the present discussion will now focus on the individual procedures called by the encoder flow diagram.

Procedure INITENCx

Figure 18:
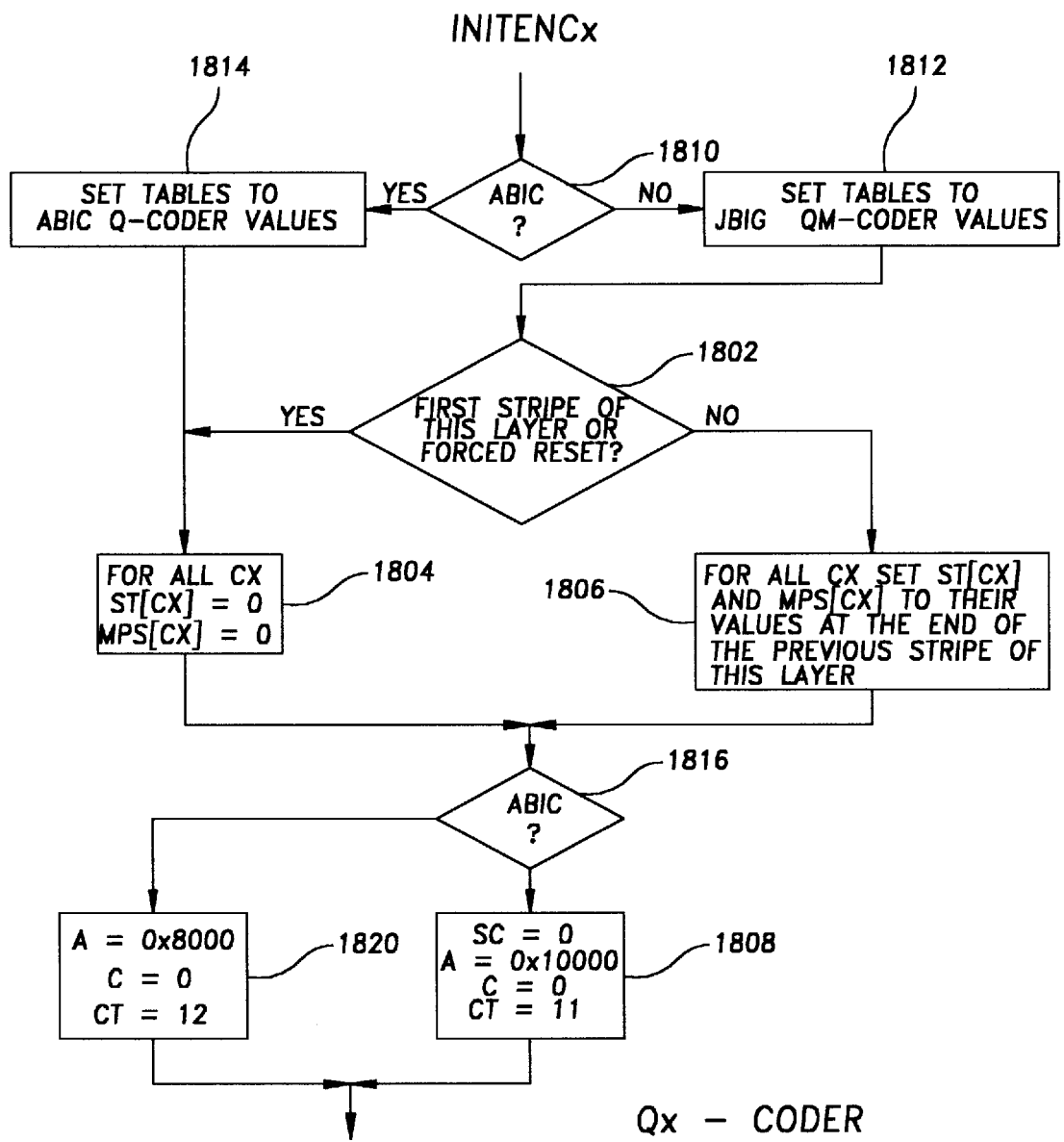

Illustrated in FIG. 18 is the procedure INITENCx called by the encoder in step 1702 of FIG. 17. The procedure begins in step 1810 where the procedure must determine whether the ABIC standard or the JBIG Standard is to be employed. It will be obvious to one having ordinary skill in the art that there are numerous methods by which to determine which encoding standard will be employed. However, the present invention employs a simple standard status variable (hereinafter standard status variable) with two states, each state determining which standard is to be applied. Accordingly, if the ABIC standard is not to be employed, the procedure INITENCx proceeds to step 1812. In step 1812, the probability estimation tables are set to the JBIG QM-Coder values. The values for the probability estimation LSZ, NLPS, NMPS and SWTCH for the JBIG Standard are expressly shown in Table 3 and in the JBIG International Standard p. 31. If the ABIC standard is being employed, procedure INITENCx proceeds to step 1814 where the probability estimation tables are initialized to the ABIC Q-Coder values. The ABIC probability estimation tables are detailed in Table 10. From step 1812, the INITENCx procedure then proceeds to step 1802 where a decision is made as to whether the current stripe is at the top of an image or a reset is forced. In particular, if the current stripe is at the top of the image, the encoder proceeds to step 1804 where the probability estimation states for all possible values of the context CX are set to 0, that is, the state of each context CX (ST[CX]) is set equal to 0 and the more probable symbol value (MPS[CX]) is set equal to 0. If the current stripe is not the first stripe of the image and a reset is not forced, the encoder proceeds to step 1806. In step 1806, all the state (ST) and MPS values for each context CX are reset to their values at the end of the last stripe at this resolution. After either step 1804 or 1806, the encoder proceeds to step 1816. In step 1816, the standard status variable is tested once again to determine whether the ABIC or JBIG Standard is being employed. If the JBIG Standard is being employed the procedure INITENCx proceeds to step 1808. In step 1808, the stack count SC and the code register C are cleared. The counter CT is set to 11 (a byte plus 3 spacer bits), and the coding interval size register A is set to 0x10000. Therefore, in step 1808, the code register C is set to the bottom of the interval (i.e. 0), and the interval size register A is set to the maximum size of the interval (i.e. 0x10000). If the standard status variable in step 1816 indicates that the ABIC standard is being employed, the procedure INITENCx proceeds to step 1820. In step 1820, the interval size register A is set equal to 0x8000, the code register C is set equal to zero and the counter CT is set equal to 12.

Procedure ENCODEx

Figure 19:
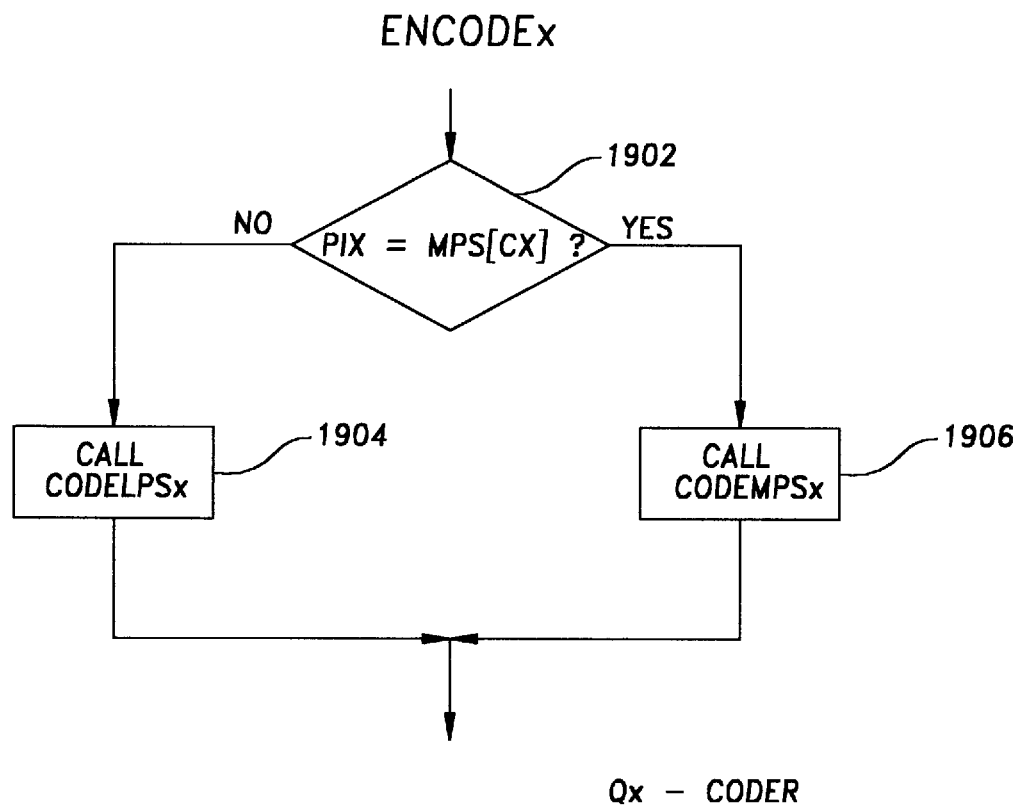

Illustrated in FIG. 19 is the procedure ENCODEx. The procedure ENCODEx is similar to the ENCODE procedure shown in FIG. 6. In step 1902, the current symbol PIX is tested to see if it equals the value currently thought to be more probable (i.e. MPS[CX]). If PIX equals the value currently thought to be more probable, the encoder proceeds to step 1906 and calls procedure CODEMPSx. If, however, PIX does not equal the value thought to be more probable, the encoder proceeds to step 1904 and calls procedure CODELPSx.

Procedure CODELPSx

Figure 20:
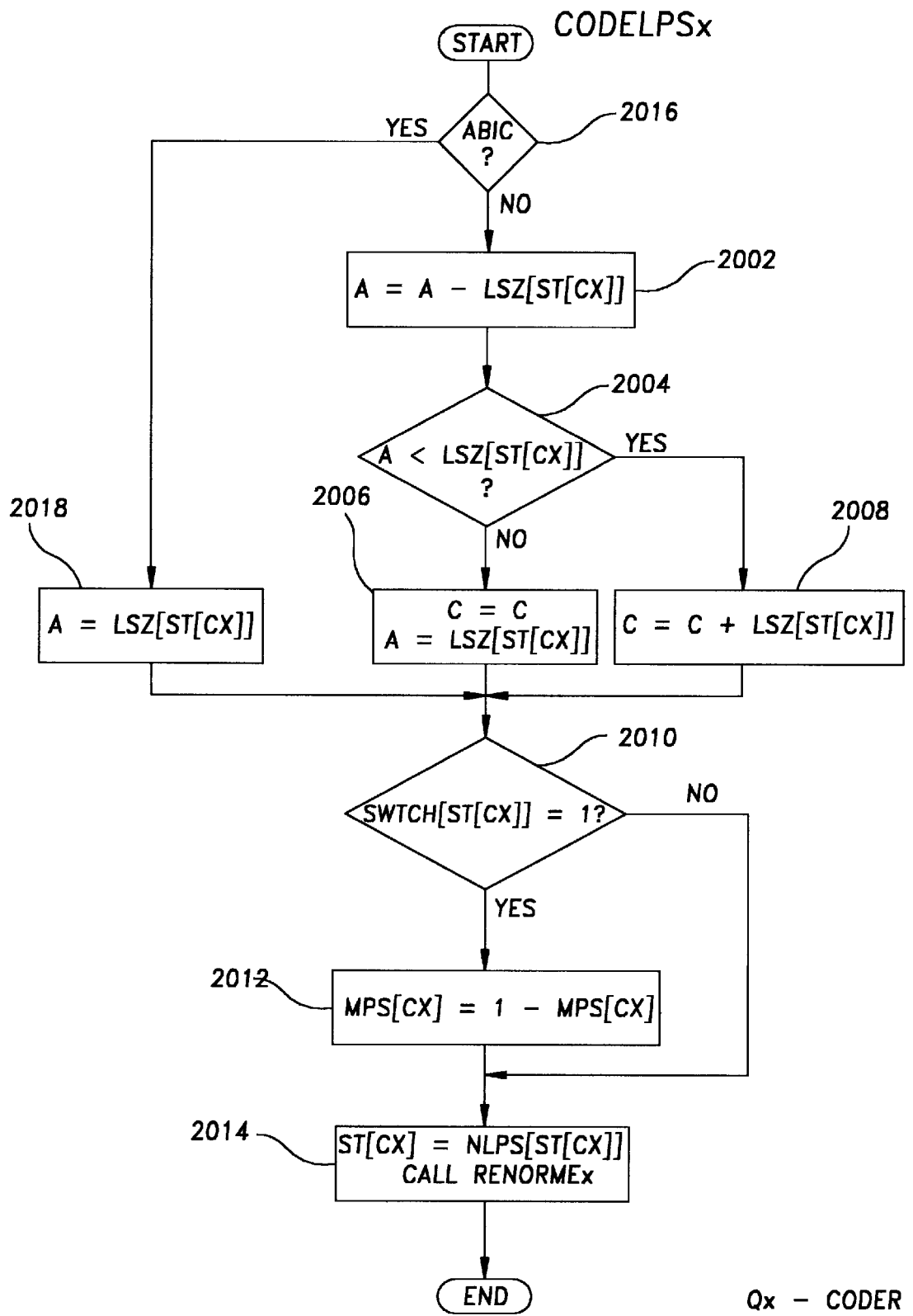

Illustrated in FIG. 20 is the CODELPSx procedure. The procedure CODELPSx is similar to the CODELPS procedure shown in FIG. 7. Before discussing the CODELPSx procedure, a review of the variables and their meanings that appear in the procedure CODELPSx and the remaining procedures will be discussed. For each possible value of the context CX, a 1-bit value MPS[CX] and a 7-bit value ST[CX] are utilized to identify the adaptive probability estimate associated with that particular context CX. The MPS[CX] is more probable color for the pixel PIX. The variable LSZ is the probability estimate. The variables NLPS and NMPS are, respectively, the next probability estimation state for an LPS and an MPS. For each possible context CX, the variables LSZ, NLPS, NMPS and SWTCH are defined in a probability estimation table shown excerpted from the JBIG Standard and shown in Table 3. The same table appears on p. 31 of the JBIG Standard. If the ABIC standard is being employed, the probability estimation table is shown in Table 10. Therefore, for each CX value, the encoder in JBIG or ABIC mode can look up LSZ, NLPS, NMPS and SWTCH values.

Still referring to FIG. 20, the procedure CODELPSx starts at step 2016, where the procedure CODELPSx tests the standard status variable to determine whether the encoder is executing ABIC encoding or JBIG encoding. If, in step 2016, the ABIC standard is being utilized, then procedure CODELPSx proceeds to step 2018. In step 2018, the interval A is set equal to the probability estimate LSZ[ST[CX]]. If the JBIG Standard is being employed, the procedure CODELPSx proceeds to step 2002 where the interval A is adjusted by subtracting the probability estimate LSZ[ST[CX]] from the interval size register A.

In step 2004, the CODELPSx procedure tests the adjusted interval A to determine whether it is less than the probability estimate LSZ[ST[CX]]. If the interval A is less than the probability estimate LSZ[ST[CX]], then a conditional exchange is required and the procedure CODELPSx proceeds to step 2008. In step 2008, the code register C is adjusted by adding to it the probability estimate LSZ[ST[CX]]. If a conditional exchange is not required, then the procedure CODELPSx proceeds to step 2006. In step 2006, the code register value C is not modified, but the interval A is set equal to the probability estimate value LSZ[ST[CX]]. The procedure CODELPSx then proceeds to step 2010 where the SWTCH variable for a given context ST[CX] is tested to determine whether it is equal to 1. The SWTCH variable is used to determine whether the 1-bit MPS[CX] value must be inverted. If SWTCH for the given context CX equals 1, then the procedure CODELPSx proceeds to step 2012. In step 2012, the 1-bit value MPS[CX] is inverted by a subtraction operation (i.e. MPS[CX]=1-MPS[CX]). However, if SWTCH does not equal 1, the procedure CODELPSx proceeds to step 2014. In step 2014, the state of the current context ST[CX] is set to the next probability estimation state for the observed LPS (i.e. ST[CX]=NLPS [ST[CX]]). After the state of the current context CX is updated, the procedure CODELPSx calls the procedure RENORMEx. The procedure RENORMEx will hereinafter be discussed in more detail with the text associated with FIG. 22.

Procedure CODEMPSx

Figure 21:
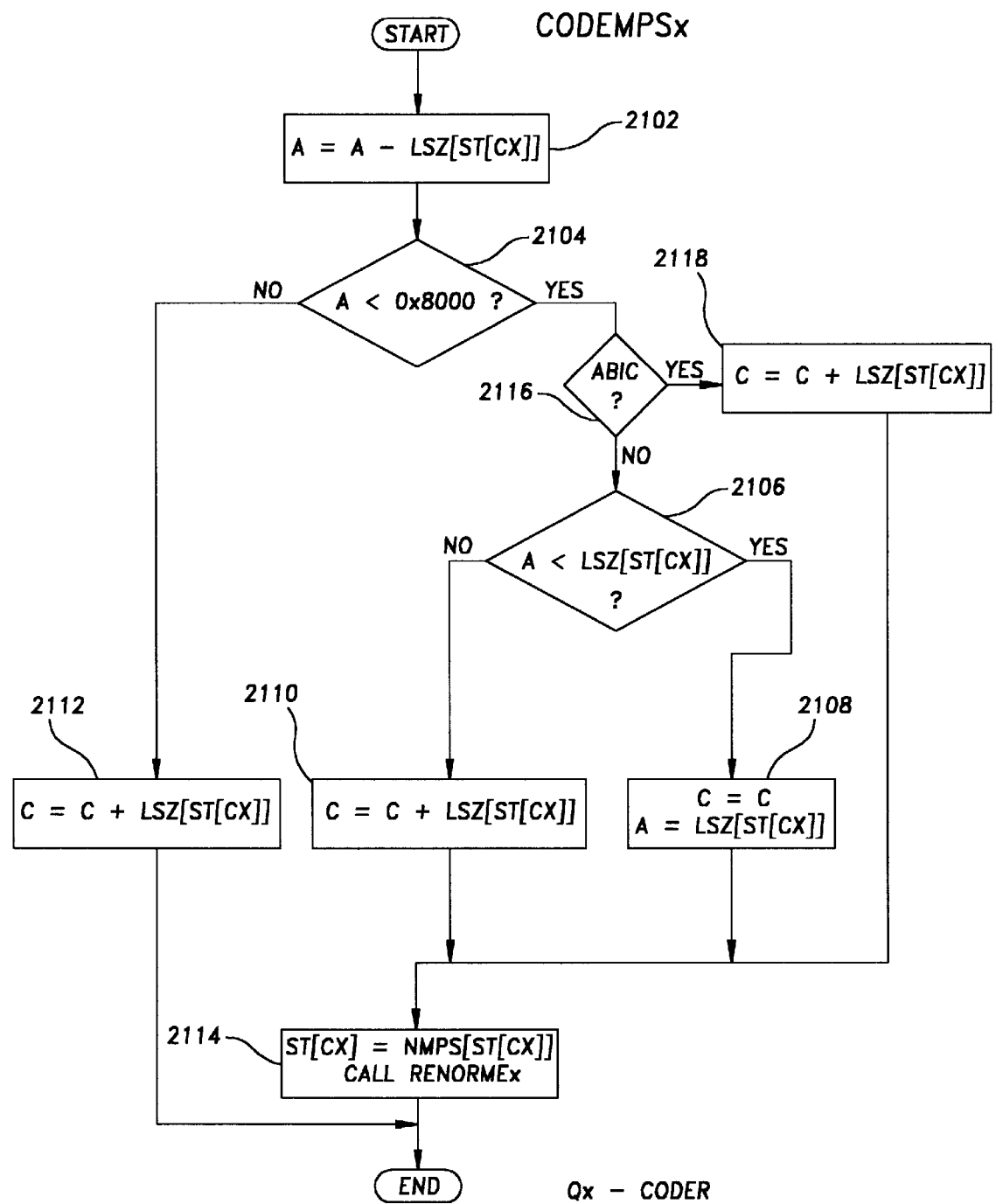

Referring now to FIG. 21, a flowchart for the procedure CODEMPSx is shown. The procedure CODEMPSx starts at step 2102 where interval A is adjusted by subtracting the probability estimate LSZ[ST[CX]] from the interval A. The procedure CODEMPSx then proceeds to step 2104 where the interval A is tested to determine if a renormalization is required because the interval A is less than 0x8000. If the interval A is less than 0x8000, the procedure CODEMPSx proceeds to step 2116. In step 2116, the procedure CODEMPSx determines whether an ABIC or JBIG Standard is being utilized by checking the standard status variable. If the JBIG Standard is being utilized, the procedure CODEMPSx proceeds to step 2106. In step 2106, the interval A is tested to further determine whether a conditional exchange is necessary if the interval A is less than the probability estimate LSZ[ST[CX]]. If the interval A is less than the probability estimate LSZ[ST[CX]], then CODEMPSx proceeds to step 2108. In step 2108, the code register C is not modified, however, the interval A is adjusted so that it equals the probability estimate LSZ[ST[CX]]. If the interval A is not less than the probability estimate LSZ[ST[CX]] in step 2106, the procedure CODEMPSx proceeds to step 2110. In step 2110, the code register C is adjusted by adding the probability estimate LSZ[ST[CX]] to the code register C. If, in step 2116, the ABIC standard is being utilized, the procedure CODEMPSx proceeds to step 2118, the code register C is set equal to its current contents plus the probability estimate LSZ[ST[CX]]. The procedure CODEMPSx then proceeds to step 2114 from either steps 2110, 2108 or 2118.

In step 2114, the state of the current context ST[CX] is set equal to the next probability estimation state for the observed MPS (i.e. NMPS[ST[CX]]). Lastly, in step 2114, the procedure CODEMPSx calls the procedure RENORMEx. As noted earlier, a detailed discussion of the procedure RENORMEx accompanies the discussion associated with FIG. 22. If, in step 2104, the interval A is not less than 0x8000, thereby indicating that the interval A is at or above the lower boundary of 0x8000, the procedure CODEMPSx proceeds to step 2112. In step 2112, the code register C is adjusted by adding the probability estimation value LSZ[ST[CX]] to the code register C.

Procedure RENORMEx

Figure 22:
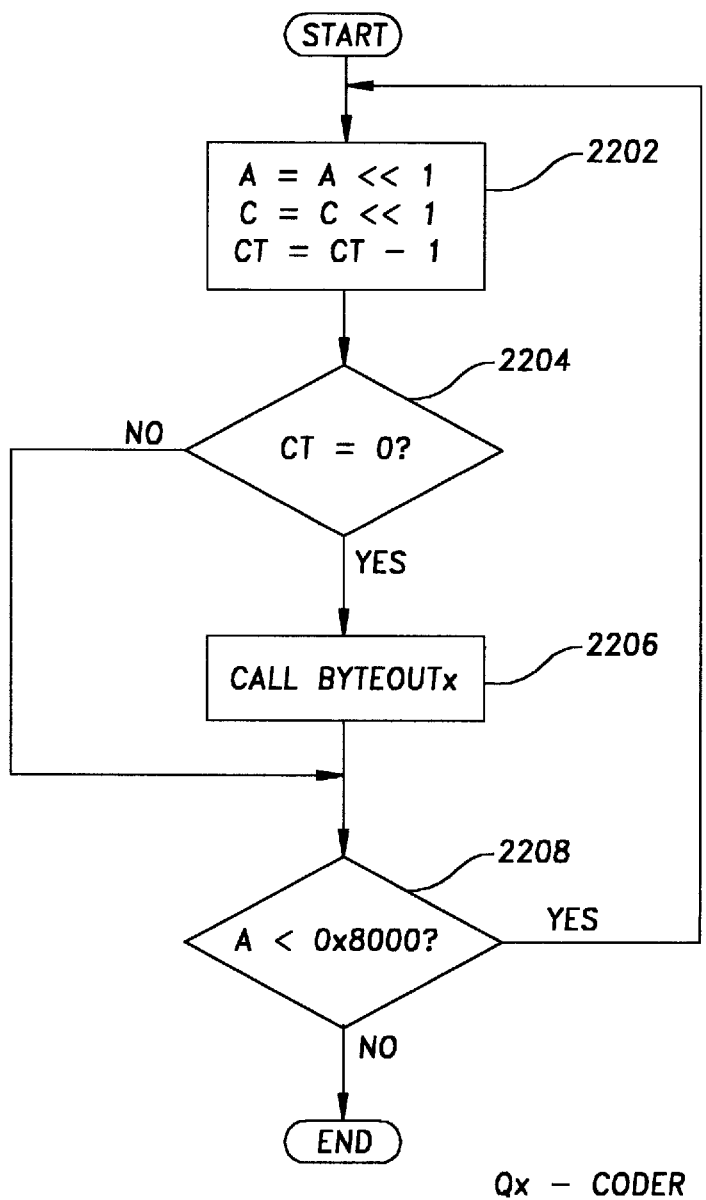

Illustrated in FIG. 22 is a flowchart showing the RENORMEx procedure. The REMORMEx procedure is similar to the RENORME procedure of FIG. 9. The RENORMEx procedure starts at step 2202 where both the interval size register A and the code register C are shifted one bit at a time to the left via a binary left shift operation ("<<"). The number of binary shifts that are performed are tracked by the counter CT. To recall, the INITENCx procedure initialized the counter CT to a value of 11 or 12 (depending on whether the JBIG Standard or the ABIC standard is being employed). Therefore, in step 2202, the value of counter CT is decremented once each time a binary left shift operation is performed on the interval size register A and the code register C. The procedure RENORMEx then proceeds to step 2204 where the counter CT is tested to determine whether it is equal to 0. If counter CT is equal to 0, the procedure RENORMEx proceeds to step 2206 and calls a procedure BYTEOUTx. The procedure BYTEOUTx removes a byte of compressed data from the code register C. A detailed discussion of the procedure BYTEOUTx is given in the text associated with FIG. 23A. If, in step 2204, the counter CT does not equal 0, the procedure RENORMEx proceeds to step 2208. Step 2208 tests the interval size register A to determine whether it is less than 0x8000 (i.e., below the lower boundary of the interval size register A). If the interval size register A is less than 0x8000, the procedure RENORME proceeds back to step 2202 and continues to perform binary left shift operations on the interval size register A and the code register C. If the interval size register A is not less than 0x8000, the procedure RENORME ends.

Procedure BYTEOUTx

Figure 23A:
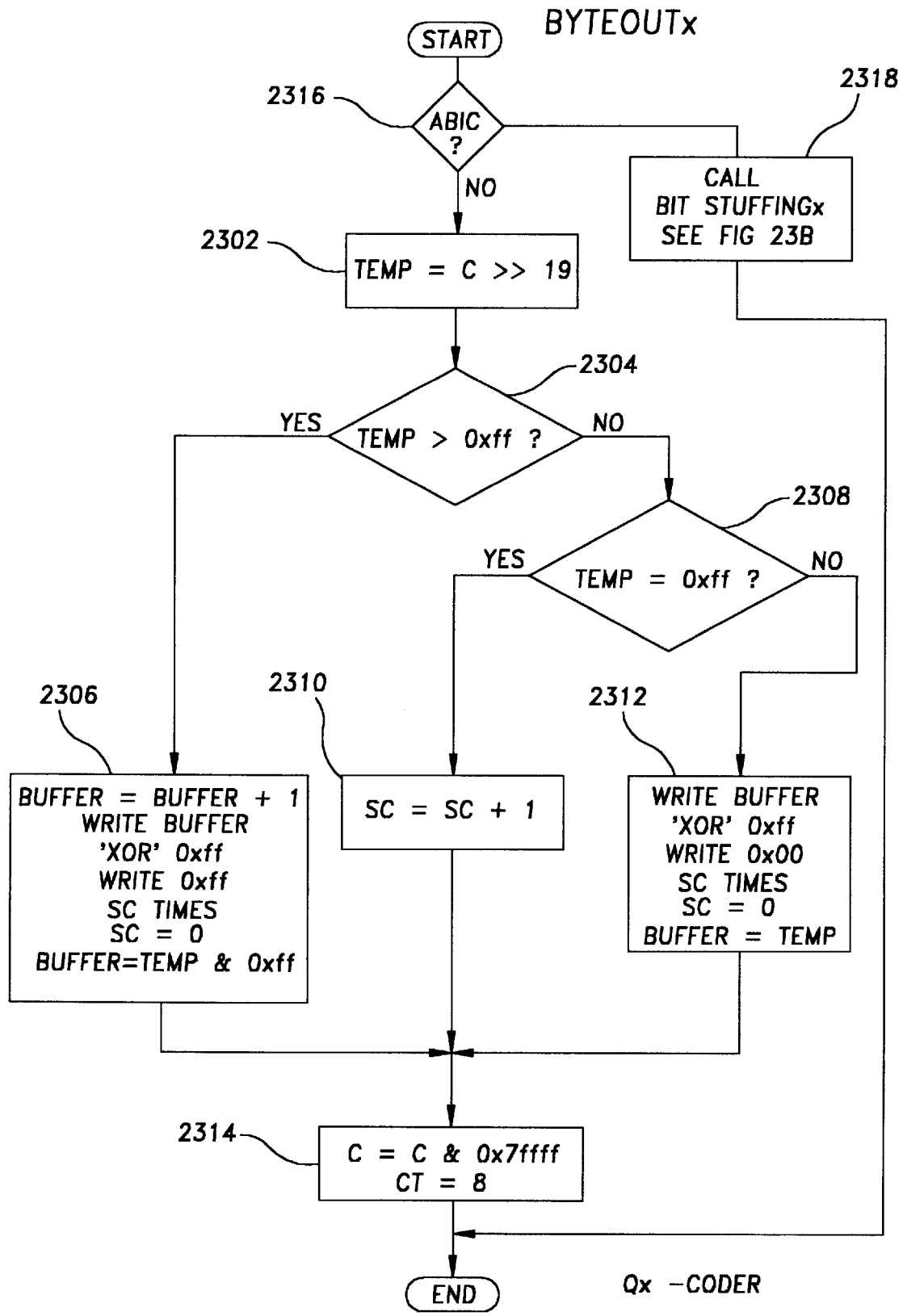

Illustrated in FIG. 23A is the procedure BYTEOUTx. The procedure BYTEOUTx is called from the procedure RENORMEx. The procedure BYTEOUTx starts in step 2316 where it is determined whether the ABIC or JBIG Standard is being utilized via the standard status variable. If the JBIG Standard is being utilized, the procedure BYTE-OUTx proceeds to step 2302. In step 2302, a variable TEMP is set equal to the code register C contents binary right shifted by 19 bits. The shift of the code register C by 19 bits aligns the output bits "b" with the low order bits of TEMP. The variable TEMP holds the byte at the top of the code register C that is to be output, plus a carry indication. In step 2304, the variable TEMP is tested to determine whether it is greater than 0xff, that is, whether a carry needs to be resolved. If a carry has occurred, the procedure BYTEOUTx proceeds to step 2306. In step 2306, a variable BUFFER holds the most recent tentative output that was not equal to 0xff. In step 2306, the value of BUFFER is incremented by one (i.e. the carry is added to BUFFER) and BUFFER is then exclusive ORed ('XOR') with 0xff, causing BUFFER to be inverted, and then written as an output. Moreover, in step 2306 the BYTEOUTx procedure writes to the output buffer all of the stacked 0xff bytes that the carry converted to 0x00 bytes which the inversion procedure converts back to 0xff bytes. Also, in step 2306, the stack counter SC is reset to zero. Lastly, in step 2306, eight bits are assigned to BUFFER by ANDing TEMP with 0xff (i.e. BUFFER= TEMP & 0xff).

If a carry has not occurred, as determined by step 2304, the procedure BYTEOUTx proceeds to step 2308. In step 2308, the variable TEMP is tested to determine whether it is equal to 0xff thereby indicating that it should be stacked. However, under the condition that TEMP=0xff, the procedure BYTEOUTx proceeds to step 2310. In step 2310, the 0xff bytes are counted or stacked by the stack counter SC by incrementing SC each time TEMP=0xff. Under the condition that TEMP does not equal 0xff, in step 2308, the procedure BYTEOUTx proceeds to step 2312. In step 2312, BUFFER is inverted by an exclusive OR ('XOR') operation with 0xff and written to the output buffer. Additionally, in step 2312, all of the stacked 0xff bytes are written SC times as 0x00 bytes (i.e. inverted 0xff) and the high order byte of the C register, i.e. TEMP, is assigned to BUFFER. Lastly, from either steps 2306, 2310 or 2312, the procedure BYTE-OUTx proceeds to step 2314. In step 2314, the C register's carry bit and output byte are cleared (i.e. C=C & 0x7ffff) and the counter CT is set to eight. The inversions performed in steps 2306 and 2312 are necessary so that a proper output is sent to the output buffer. A proper output is defined as output equivalence with the JBIG International Standard.

Figure 23B:
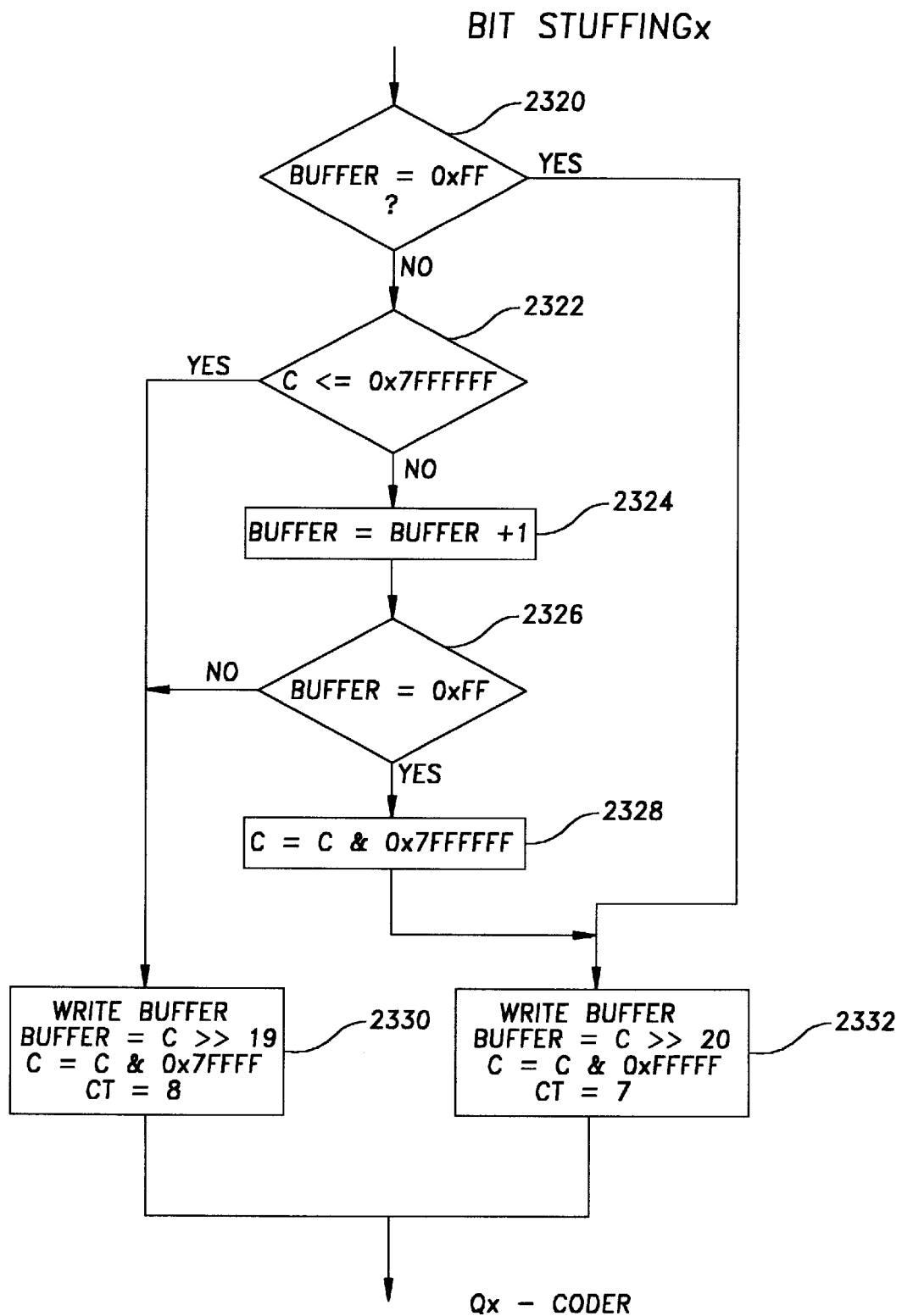

If the ABIC standard is being utilized in step 2316, the procedure BYTEOUTx proceeds to step 2318 where a procedure BIT STUFFINGx is called and which is shown in detail in FIG. 23B. Referring now to FIG. 23B, the procedure BIT STUFFINGx determines if BUFFER is equal to 0xff in step 2320. To recall BUFFER stores the next byte to be output to the stripe coded data SCD. If BUFFER is equal to 0xff, procedure BYTEOUTx proceeds to step 2332. In step 2332, BUFFER is output to SCD. BUFFER is then assigned the code register C binary right shifted 20 bit positions. Also in step 2332, the code register C is ANDed with 0xfffff and set equal to the result, thus removing the byte placed in BUFFER. Step 2332, in effect, stuffs a zero bit in the most significant bit of BUFFER with the purpose of catching a future carry that might otherwise propagate through the byte currently stored in BUFFER to the byte which was previously in BUFFER that was equal to 0xff. Additionally, in step 2332, the counter count CT is set to seven.

If BUFFER is not equal to 0xff in step 2320, the procedure BIT STUFFINGx proceeds to step 2322. In step 2322, the procedure BIT STUFFINGx determines if a carry needs to be resolved by testing the code register C to determine if it is less than or equal to 0x7fffff. If the code register C is less than or equal to 0x7fffff, then there is no carry that needs to be resolved and the procedure BIT STUFFINGx proceeds to step 2330. In step 2330, BUFFER is written to the SCD. BUFFER is then set equal to the code register C binary shifted right by 19 bits (i.e. a new byte is placed in BUFFER from the code register C). Also in step 2330, the code register C is ANDed with 0x7ffff which, in effect, removes the byte previously stored to BUFFER and the counter CT is set to eight. If, in step 2322, there is a carry that needs to be resolved, that is, the code register C is greater than 0x7fffff, the procedure BIT STUFFINGx proceeds to step 2324. In step 2324, a value of 1 is added to BUFFER (BUFFER=BUFFER+1) which in effect adds the carry to BUFFER. In step 2326, BUFFER is tested to determine if it is now equal to 0xff because a bit must be stuffed after every 0xff byte in order to allow resolution of future carries. Accordingly, if BUFFER equals 0xff, procedure BIT STUFFINGx proceeds to step 2328. In step 2328, the carry bit is masked off by ANDing the code register C with 0x7fffff. In step 2332, the procedure BIT STUFFINGx writes BUFFER to the stripe coded data, assigns to BUFFER the code register C binary right shift by 20 bits, masks off the byte just assigned to BUFFER from C, and sets the counter CT to seven. If, in step 2326, BUFFER does not equal 0xff, the procedure BIT STUFFINGx proceeds to step 2330. The details of step 2330 have been discussed above.

Procedure FLUSHx

Figure 24:
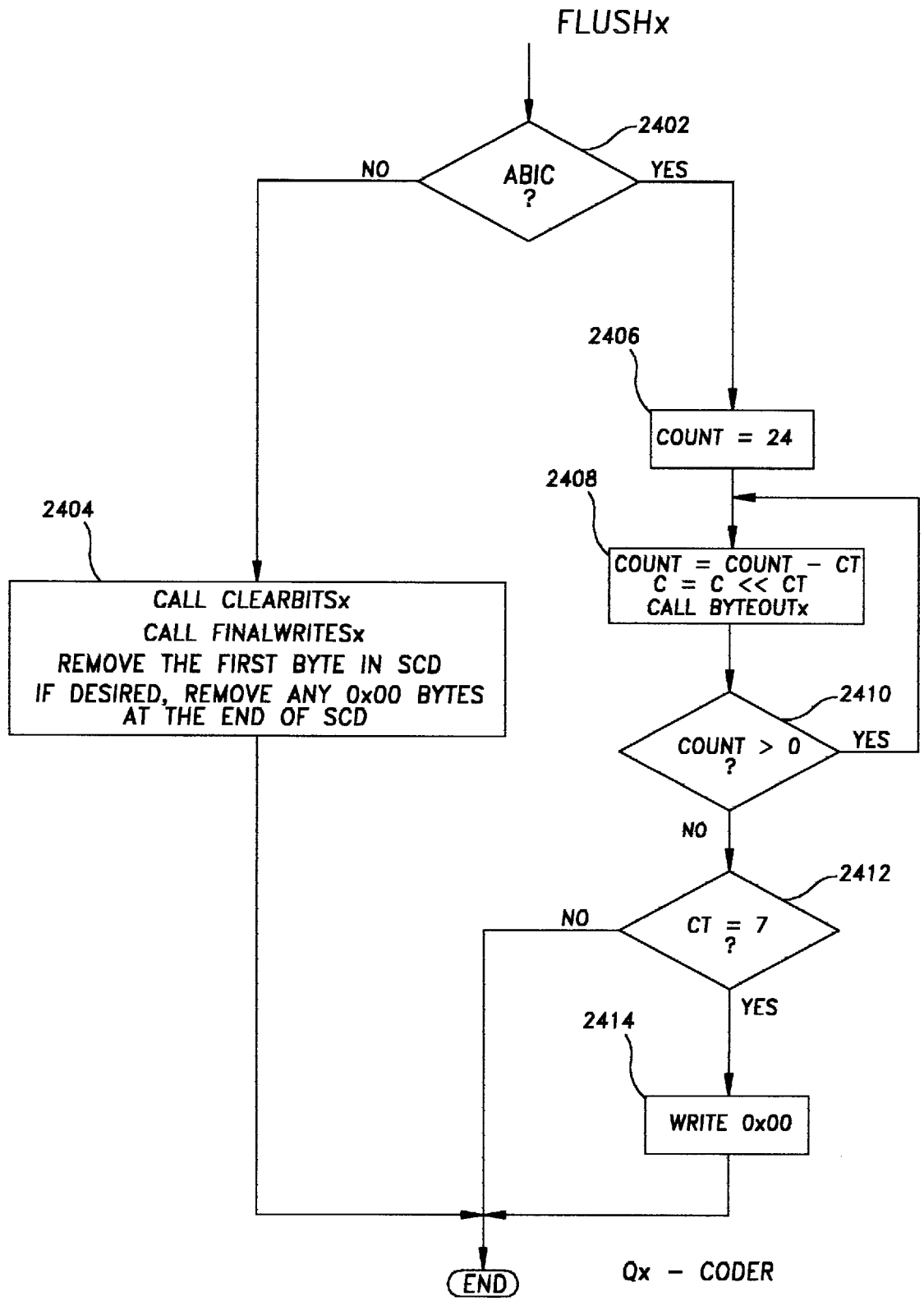

Referring now to FIG. 24, a flowchart illustrating the procedure FLUSHx of the of the present invention is shown. The FLUSHx procedure first determines in step 2402 whether the ABIC or JBIG Standard is being utilized via the standard status variable. If the ABIC standard is being utilized, procedure FLUSHx proceeds to step 2406 where a variable COUNT is set to twenty-four to indicate the maximum potential number of bits that have not been output out of the code register C. In step 2408, the procedure FLUSHx decrements COUNT by the counter value CT which subtracts out the number of bits which need not be output from the code register C. Also, in step 2408, the code register C is binary left shifted by CT bits to align the output byte before calling the procedure BYTEOUTx to take the high order byte out of the code register C. In step 2410, the procedure FLUSHx tests COUNT to determine whether there are additional bytes that need to be removed from the code register C (i.e., COUNT>0?). If there are more bytes to be removed from the code register C, procedure FLUSHx then proceeds back to step 2408. Otherwise, procedure FLUSHx advances to step 2412 where the variable CT is tested to determine whether or not it is equal to seven. If CT is equal to seven, then procedure FLUSHx advances to step 2414 where 0x00 is written to the output. If CT is not equal to seven, then the procedure FLUSHx completes execution and ends.

If, in step 2402, the JBIG Standard is being utilized, the procedure FLUSHx proceeds to step 2404. In step 2404, the procedure FLUSHx calls a procedure known as CLEAR-BITSx to set the code register C to a value in the interval between C and C+A−1 that ends with the greatest possible number of 0 bits after inversion. The procedure CLEARBITSx has been described, supra, and accordingly, the reader is referred to that section for details. The procedure FLUSHx then calls on a procedure FINALWRITESx. The procedure FINALWRITESx performs the final carry resolution and writes two bytes from the code register to the stripe coded data SCD stream. The procedure FINALWRITESx is identical to the procedure FINALWRITES described, supra, and shown in FIG. 14 and thus the reader is once again directed to the above discussion for details. The procedure FLUSHx then removes the first byte that was written into the SCD stream and any 0x00 bytes at the end of the stripe coded data SCD stream are removed until a byte not equal to 0x00 is encountered. This procedure of removing all 0x00 bytes from the end of a stripe coded data SCD stream has been nicknamed "PACMAN" because the nibbling away of trailing 0x00's is similar to the popular computer game of that same name.

Procedure FINALWRITESx

Figure 25:
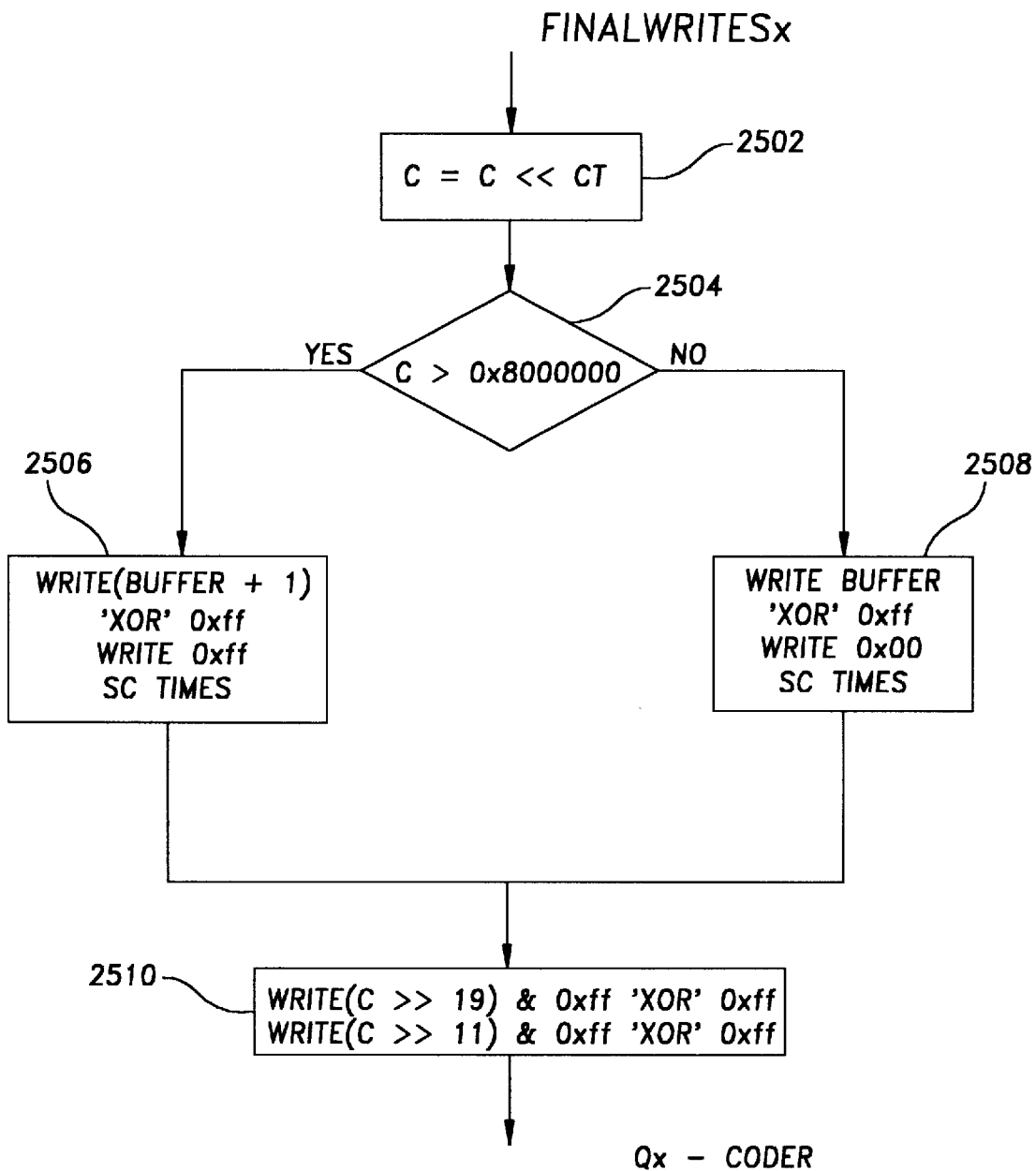

In procedure FINALWRITESx, shown in FIG. 25, the final carry resolution is resolved and two bytes from the code register C are written to the output buffer. In particular, in step 2502, the code register is shifted logic left CT (i.e. counter value) times. The code register C is then tested, in step 2504, to determine whether it is greater than 0x8000000. If the code register C is greater than 0x8000000, then the procedure FINALWRITESx proceeds to step 2506. In step 2506 the variable BUFFER is incremented by one and inverted via the 'XOR' operation before it is written to the output buffer. Also in step 2506, 0xff is written SC (i.e. stack counter) times. If the code register C is not greater than 0x8000000, then the procedure FINALWRITESx proceeds to step 2508. In step 2508, the variable BUFFER is inverted via the 'XOR' operation with 0xff before it is written to the output buffer and 0x00 (i.e. inversion of 0xff) is written SC (i.e. stack counter) times to the output buffer. From either step 2506 or 2508, the procedure FINALWRITESx proceeds to step 2510. In step 2510, two bytes from the code register C are output to the output buffer. In particular, the first byte output is the code register value C shifted logic right 19 bits ANDed with 0xff and inverted via 'XOR' 0xff. The second byte output from the code register is code register value C shifted logic right 11 bits ANDed with 0xff and inverted via 'XOR' 0xff. The inversion on the output is necessary so that compliance with the JBIG International Standard is achieved.

Qx-Coder DECODER

Having described the ENCODER specifics of the present invention, the present discussion will now focus on the decoder details of the present invention. Illustrated in Tables 6, 7, 8 and 9 are the JBIG decoder, ABIC decoder and Qx-Coder decoder register assignments for the JBIG decoder and ABIC decoder. Illustrated in Table 10 is the Qx-Coder ABIC Probability Estimation Table.

TABLE 6

JBIG QM-Coder Decoder Register Assignments

|  | msb | lsb |
|---|---|---|
| CHIGH register | xxxxxxxx, | xxxxxxxx |
| CLOW register | bbbbbbbb, | 00000000 |
| A register | a,aaaaaaaa, | aaaaaaaa |

TABLE 7

ABIC Q-Coder Decoder Register Assignments

|  | msb | lsb |
|---|---|---|
| CHIGH register | 000xxxxx, | xxxxxxxx |
| CLOW register | bbbbbbbb, | 00000000 |
| A register | 0001aaaa, | aaaaaaaa |

TABLE 8

Qx-Coder Decoder Register Assignments for JBIG QM-Coder

|  | msb | lsb |
|---|---|---|
| CHIGH register | xxxxxxxx, | xxxxxxxx |
| CLOW register | bbbbbbbb, | 00000000 |
| A register | aaaaaaaa, | aaaaaaaa |

TABLE 9

Qx-Coder Decoder Register Assignments for ABIC Q-Coder

|  | msb | lsb |
|---|---|---|
| CHIGH register | xxxxxxxx, | xxxxxxxx |
| CLOW register | bbbbb000, | 00000000 |
| A register | 1aaaaaaa, | aaaaa000 |

TABLE 10

Qx-Coder ABIC Q-Coder Probability Estimation Table

| ST | LSZ | NLPS | NMPS | SWTCH |
|---|---|---|---|---|
| 0 | 0x5608 | 0 | 1 | 1 |
| 1 | 0x5408 | 0 | 2 | 0 |
| 2 | 0x5008 | 1 | 3 | 0 |
| 3 | 0x4808 | 2 | 4 | 0 |
| 4 | 0x3808 | 3 | 5 | 0 |
| 5 | 0x3408 | 4 | 6 | 0 |
| 6 | 0x3008 | 5 | 7 | 0 |
| 7 | 0x2808 | 5 | 8 | 0 |
| 8 | 0x2408 | 6 | 9 | 0 |
| 9 | 0x2208 | 7 | 10 | 0 |
| 10 | 0x1c08 | 8 | 11 | 0 |
| 11 | 0x1808 | 9 | 12 | 0 |
| 12 | 0x1608 | 10 | 13 | 0 |
| 13 | 0x1408 | 11 | 14 | 0 |
| 14 | 0x1208 | 12 | 15 | 0 |
| 15 | 0x0c08 | 13 | 16 | 0 |
| 16 | 0x0908 | 14 | 17 | 0 |
| 17 | 0x0708 | 15 | 18 | 0 |
| 18 | 0x0508 | 16 | 19 | 0 |
| 19 | 0x0388 | 17 | 20 | 0 |
| 20 | 0x02c8 | 18 | 21 | 0 |
| 21 | 0x0298 | 19 | 22 | 0 |
| 22 | 0x0138 | 20 | 23 | 0 |
| 23 | 0x00b8 | 21 | 24 | 0 |
| 24 | 0x0098 | 21 | 25 | 0 |
| 25 | 0x0058 | 23 | 26 | 0 |
| 26 | 0x0038 | 23 | 27 | 0 |
| 27 | 0x0028 | 25 | 28 | 0 |
| 28 | 0x0018 | 25 | 29 | 0 |
| 29 | 0x0008 | 27 | 29 | 0 |

Figure 26:
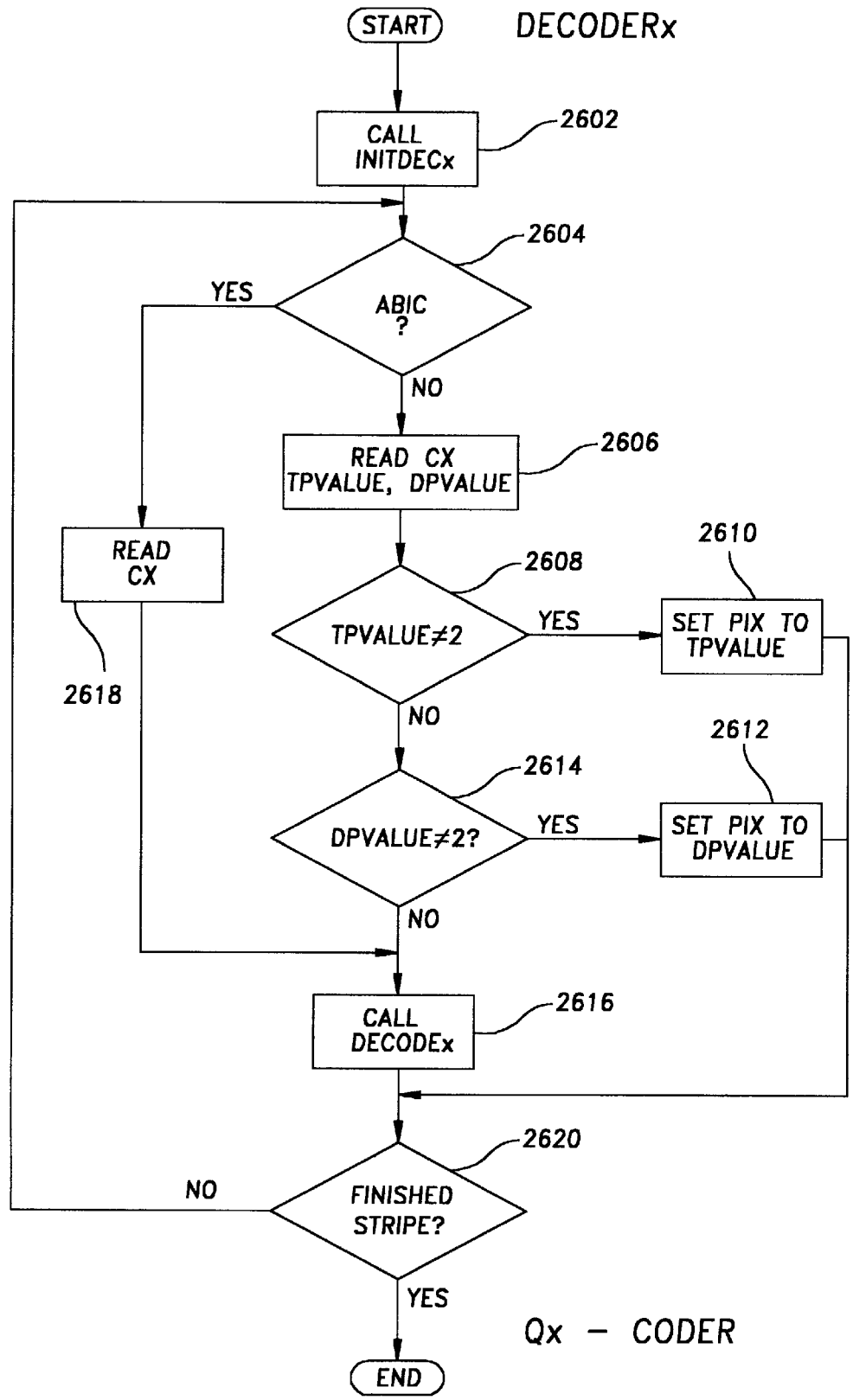
FIGS. 26–32 are flowcharts illustrating the Qx-Coder Decoder operation of the present invention employing shared hardware between the JBIG and ABIC compression standards.

In particular, reference is made to FIG. 26 where the overall decoder flow is illustrated. In step 2602 the decoder calls a procedure INITDECx. The INITDECx procedure is detailed in the text associated with FIG. 27. The decoder then proceeds to step 2604 where it is determined whether the ABIC or JBIG Standard is being employed. If the ABIC standard is being employed, the decoder proceeds to step 2618 where the context CX is read. After the context CX is read, the decoder proceeds to step 2616 where the procedure DECODEx is called. The procedure DECODEx is detailed in FIG. 28 and described in the text associated with that figure. In step 2620, the decoder determines whether a stripe has finished decoding and if so, ends the decoding process. Otherwise, the decoder proceeds back to step 2604.

If the JBIG Standard is being employed in step 2604, the decoder proceeds to step 2606. In step 2606, the decoder reads a context value (CX), a typical prediction value (TPVALUE) and a deterministic prediction value (DPVALUE). In steps 2608 and 2614, the decoder checks to see if either of the TPVALUE or the DPVALUE are not equal to 2, indicating that the deterministic prediction or the typical prediction functions are enabled. If either the TPVALUE or the DPVALUE is not equal to 2, then the decoder proceeds to steps 2610 or 2612 where the PIX value is set equal to either the TPVALUE or DPVALUE. However, if both the TPVALUE and the DPVALUE are equal to 2, the decoder calls procedure DECODEx in step 2616. In step 2620, the decoder determines whether a stripe has finished decoding and if so, ends the decoding process. Otherwise, the decoder proceeds back to step 2604.

Procedure INITDECx

Figure 27:
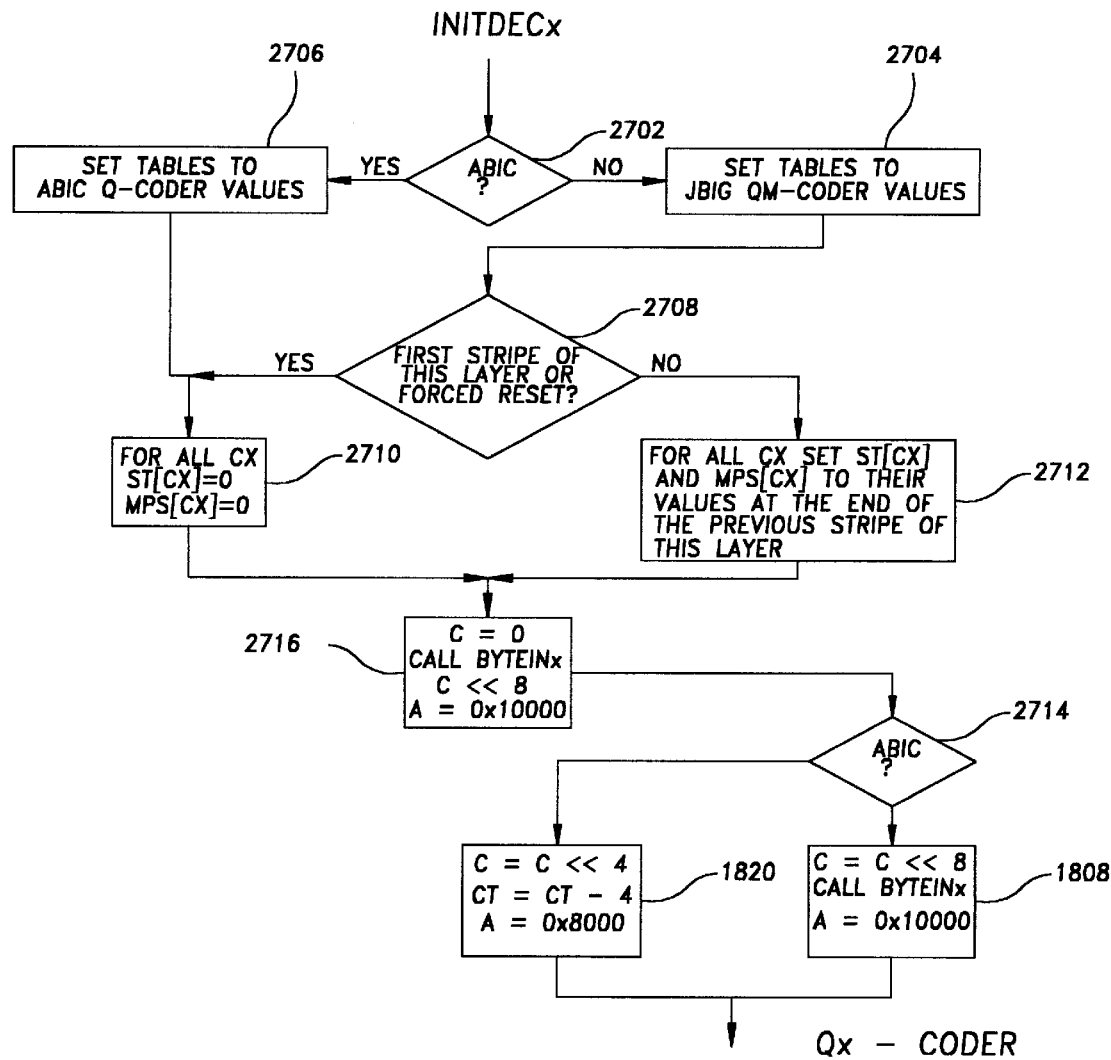
Figure 28:
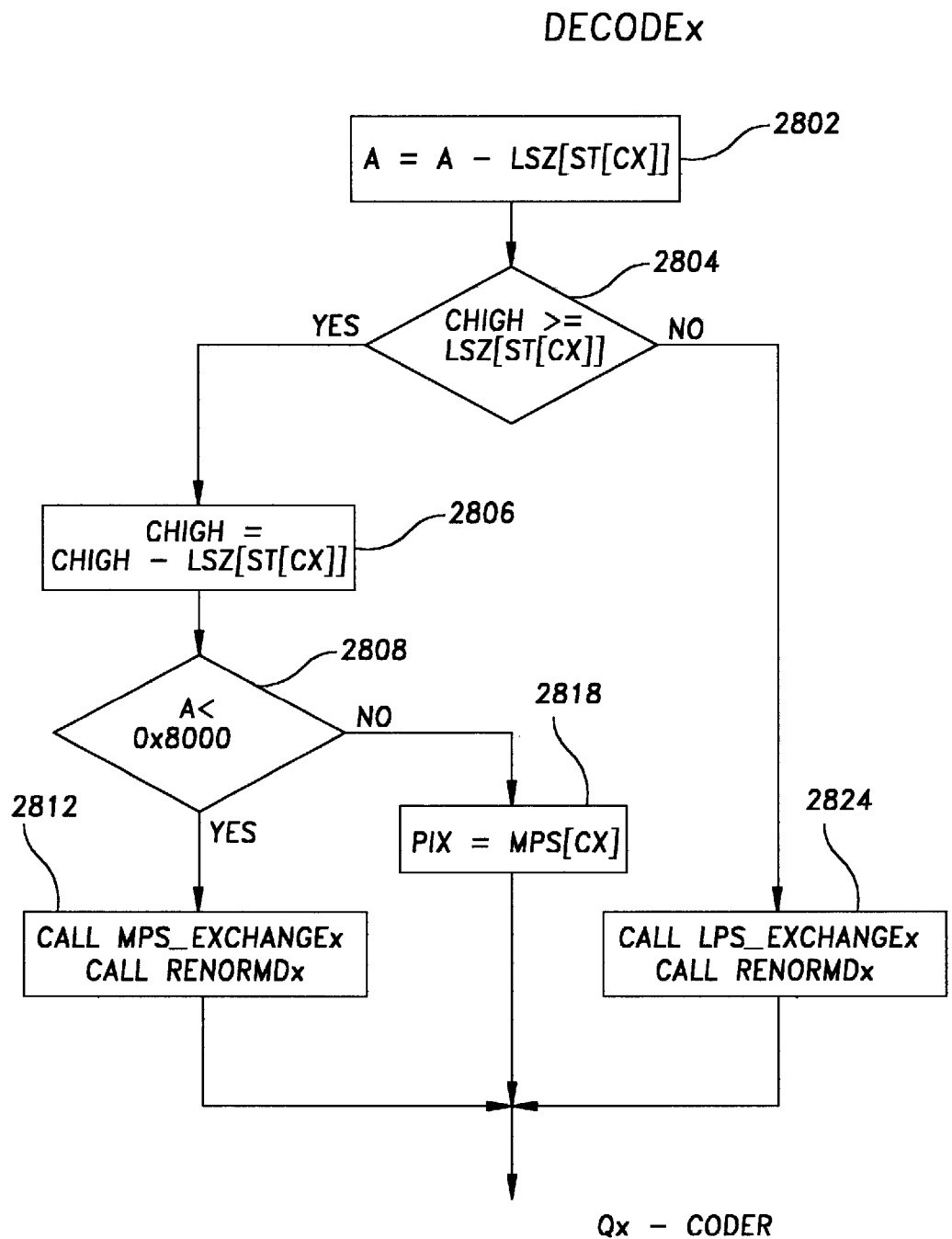

Illustrated in FIG. 27 is the procedure INITDECx called by the decoder in step 2602 of FIG. 26. The procedure begins in step 2702 where the procedure must determine whether the ABIC standard or the JBIG Standard is to be employed via the standard status variable. Accordingly, if the ABIC standard is not to be employed, the procedure INITDECx proceeds to step 2704. In step 2704, the probability estimation tables are set to the JBIG QM-Coder values. These are the same values as employed by the JBIG encoder and show in Table 3 and on p. 31 of the JBIG International Standard. If the ABIC standard is being employed, procedure INITDECx proceeds to step 2706 where the probability estimation tables are initialized to the ABIC Q-Coder values described in TABLE 10. From step 2704, the INITDECx procedure then proceeds to step 2708 where a decision is made as to whether the current stripe is at the top of an image. In particular, if the current stripe is at the top of the image, the decoder proceeds to step 2710 where the probability estimation states for all possible values of the context CX are set to 0, that is, the state of each context CX (ST[CX]) is set equal to 0 and the more probable symbol for each context (MPS[CX]) is set equal to 0. If the current stripe is not the first stripe of the image, the decoder proceeds to step 2712. In step 2712, all the states (ST) and MPS values for each context CX are reset to their values at the end of the last stripe at this resolution. After either step 2710 or 2712, the decoder proceeds to step 2716. In step 2716, two bytes are read into the code register C via two calls to procedure BYTEINx and the code register C is binary left shifted 8 bits.

In step 2714, the standard status variable is tested once again to determine whether the ABIC or JBIG Standard is being employed. If the JBIG Standard is being employed the procedure INITDECx proceeds to step 2720. If the ABIC standard is being employed, the procedure INITDECx proceeds to step 2718. In step 2718, the code register C is binary left shifted four bits and the interval size register A is set to the length of the interval at 0x8000 and the variable CT is decremented by a value of four. In step 2720, the code register is binary left shifted eight bits and another byte is read via a call to BYTEINx. Also in step 2720, the interval size register A is set to 0x10000. The procedure BYTEINx is detailed in FIG. 32 and the text associated with that figure.

Procedure DECODEx

Figure 30:
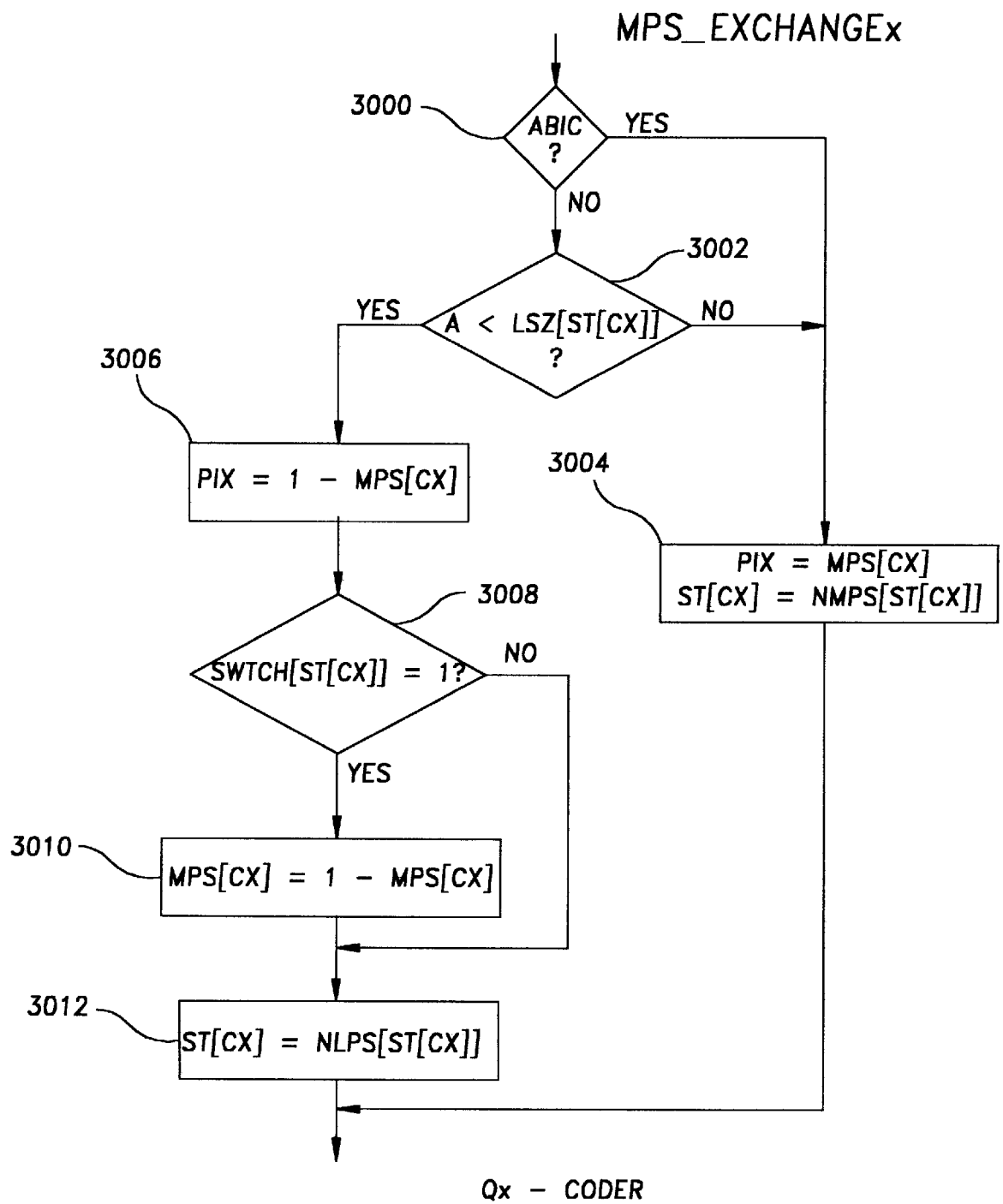

The procedure DECODEx begins in step 2802 where the probability LSZ[ST[CX]] for the current context is subtracted from the interval size register A (i.e. A=A−LSZ[ST[CX]]). In step 2804, the code register CHIGH (the high order 16 bits of the code register) is tested to determine whether it is greater than or equal to the probability estimation LSZ[ST[CX]]. If so, the probability estimation LSZ[ST[CX]] is subtracted from the code register CHIGH in step 2806. The procedure DECODEx then proceeds to step 2808 where the interval size register A is tested to determine whether a renormalization is required, that is, the interval size register A is below 0x8000. If so, the procedure DECODEx proceeds to step 2812 where the procedure MPS_EXCHANGEx and RENORMDx are called. The procedure MPS_EXCHANGE is detailed in FIG. 30 and in the test associated with that figure. The procedure RENORMDx is detailed in FIG. 31 and the text associated with that figure. If the interval size register A is not below 0x8000, the procedure DECODEx advances to step 2818 where PIX is set equal to the more probable symbol MPS[CX].

Figure 29:
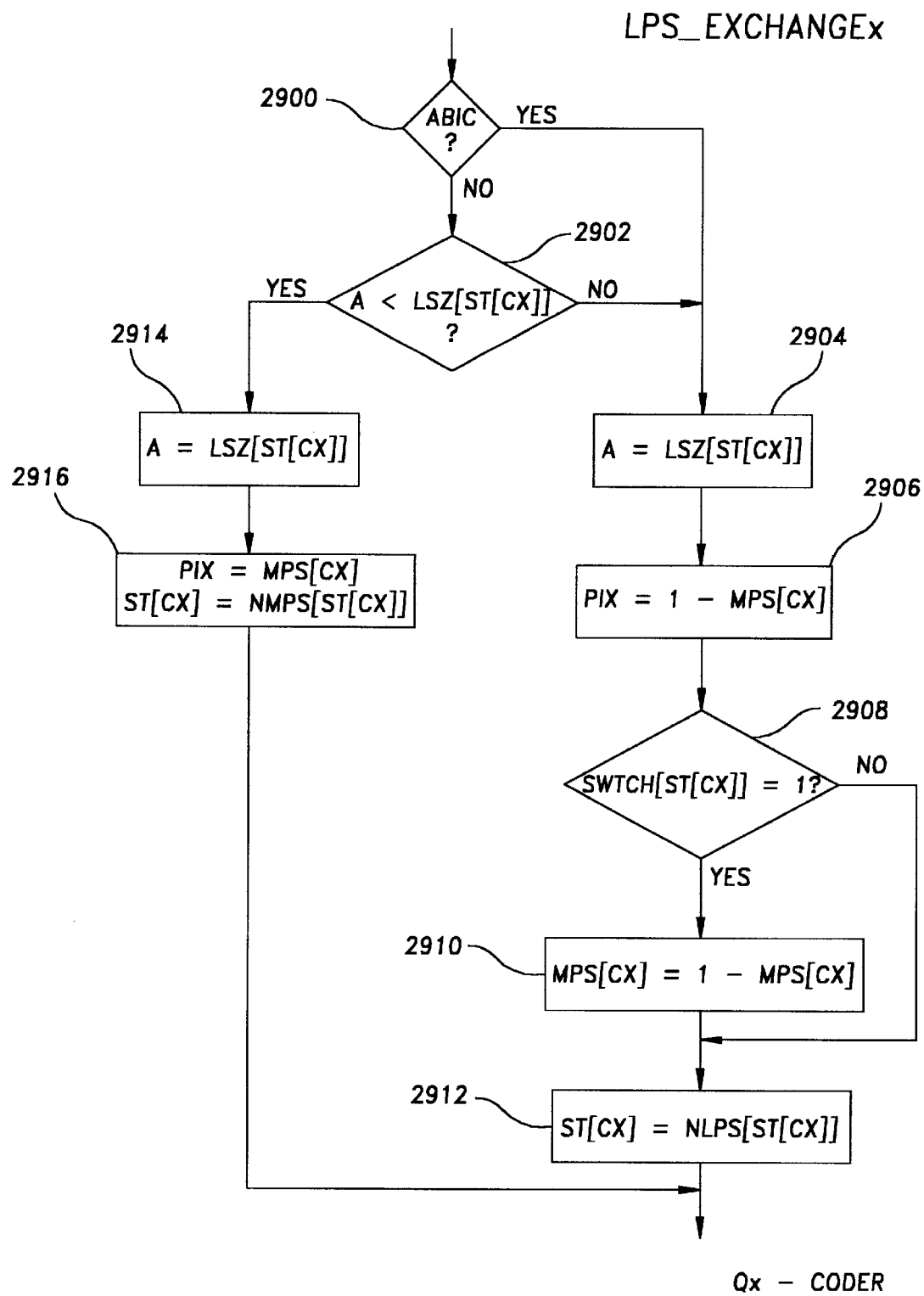

If, in step 2804, the code register CHIGH is less than the probability estimation LSZ[ST[CX]], the procedure DECODEx proceeds to step 2824, where procedures LPS_EXCHANGEx and RENORMDx are called. The procedure LPS_EXCHANGEx is detailed in FIG. 29 and the text associated with that figure.

Procedure LPS_EXCHANGEx

The procedure LPS_EXCHANGEx determines if the intervals for the LPS and MPS symbols were exchanged. The procedure LPS_EXCHANGEx commences in step 2900 where the standard status variable is tested to determine whether the ABIC standard is being utilized. If so, the procedure LPS_EXCHANGEx advances to step 2904. If the ABIC standard is not being utilized, the procedure LPS_EXCHANGEx advances to step 2902. In step 2902, interval size register A is tested to determine if it is less than the probability estimate LSZ[ST[CX]]. If so, the procedure LPS_EXCHANGEx proceeds to step 2914 where the interval size register A is set equal to the probability estimate LSZ[ST[CX]]. In step 2916, PIX is set equal to the more probable symbol MPS[CX] and the state of the current context ST[CX] is set equal to the next state (ST) via NMPS[ST[CX]]. If, in step 2902, the interval size register A is not less than the probability estimate LSZ[ST[CX]], the procedure LPS_EXCHANGEx proceeds to step 2904 where the interval size register A is set equal to the probability estimate LSZ[ST[CX]]. To recall, step 2900 also advances to step 2904 if the ABIC standard is being utilized. In step 2906, PIX is set equal to 1 minus current context is tested to determine whether it is equal to 1, i.e. whether it is active, and if so, the procedure LPS_EXCHANGEx proceeds to step 2910. In step 2910 the more probable symbol MPS[CX] is inverted (i.e. MPS[CX]=1−MPS[CX]). In step 2912, the state of the current context ST[CX] is set equal to the next state (ST) via NLPS[ST[CX]]. If, in step 2908, the switch variable SWTCH[ST[CX]] is not set, then the procedure LPS_EXCHANGEx proceeds to step 2912.

Procedure MPS_EXCHANGEx

The procedure MPS_EXCHANGEx determines if the intervals for the MPS and LPS symbols were exchanged. The procedure MPS_EXCHANGEx commences in step 3000 where the standard status variable is tested to determine whether the ABIC standard is being utilized. If so, the procedure MPS_EXCHANGEx advances to step 3004. If the ABIC standard is not being utilized, the procedure MPS_EXCHANGEx advances to step 3002. In step 3002, the interval size register A is tested in step 3002 to determine if it is less than the probability estimate LSZ[ST[CX]]. If so, the procedure MPS_EXCHANGEx proceeds to step 3006 where PIX is set equal to 1 minus the more probable symbol MPS[CX]. In step 3008, the switch variable SWTCH for the current context is tested to determine whether it is equal to 1, i.e. whether it is active, and if so, the procedure MPS_EXCHANGEx proceeds to step 3010. In step 3010 the more probable symbol MPS[CX] is inverted (i.e. MPS[CX]=1-MPS[CX]). In step 3012, the state of the current context ST[CX] is set equal to the next state (ST) via NLPS[ST[CX]]. If, in step 3008, the switch variable SWTCH[ST[CX]] is not set, then the procedure LPS_EXCHANGEx proceeds to step 3012.

If, however, the interval size register A is not less than the probability estimate LSZ[ST[CX]], the procedure MPS_EXCHANGEx proceeds to step 3004. To recall, step 3000 also advances to step 3004 if the ABIC standard is being utilized. In step 3004, PIX is set equal to the more probable symbol MPS[CX] and the state of the current context ST[CX] is set equal to the next state (ST) via NMPS[ST[CX]].

Procedure RENORMDx

Figure 31:
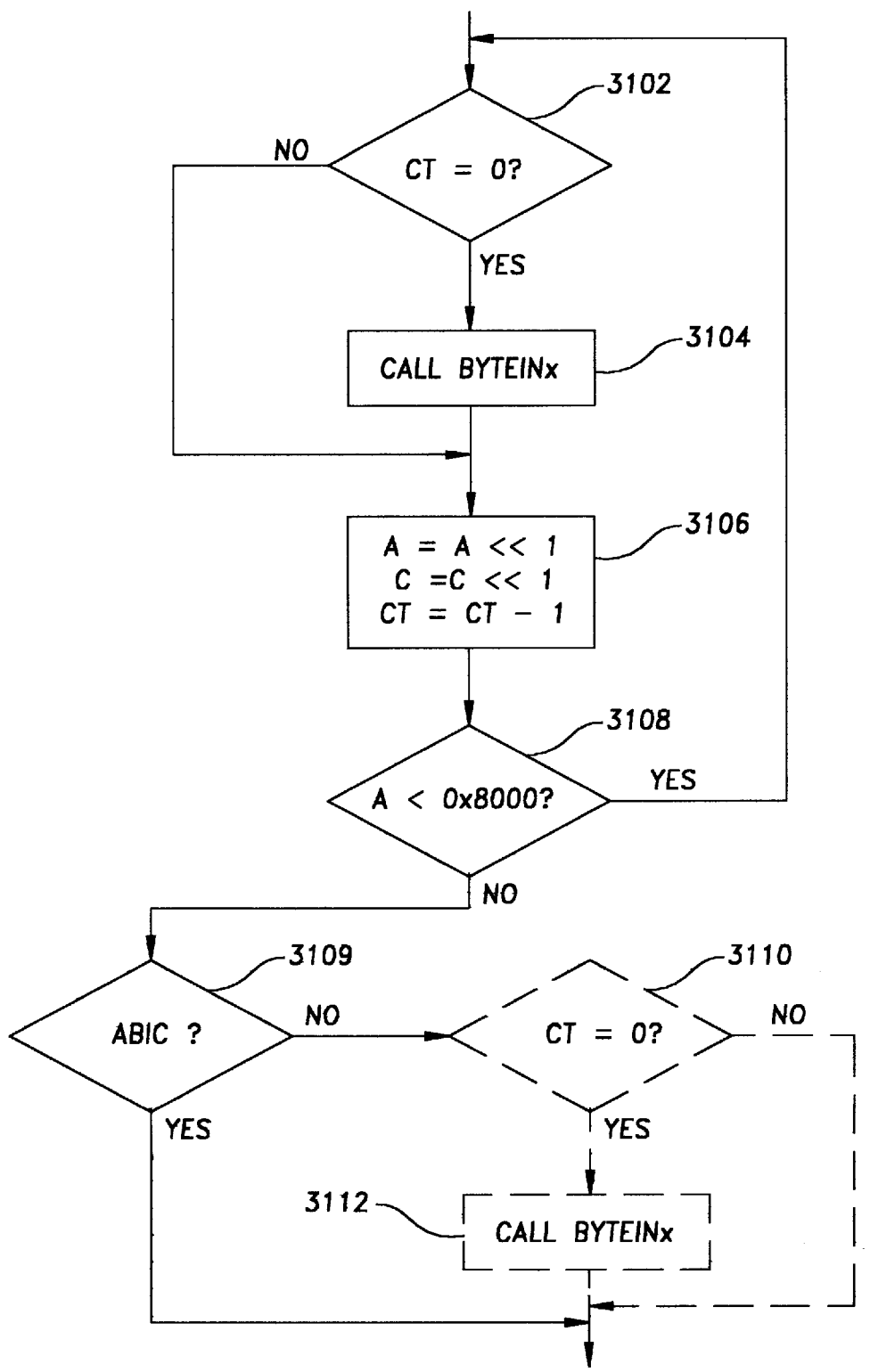

To recall, renormalization must occur each time the interval size register falls below 0x8000 and the procedure for the present invention is shown in FIG. 31. The procedure begins in step 3102 where a counter value CT is tested to determine whether CT is equal to zero. If the counter value CT is zero, a byte is inserted into the code register C via a call to BYTEINx in step 3104. The interval size register A and the code register C are binary left shifted one bit and the counter value CT is decremented by one in step 3106. In step 3108, the interval size register A is tested to determine whether it is currently below the "renorm" or "minimum size" at 0x8000. If so, the procedure RENORMDx proceeds back to step 3102 and continues. If the interval size register A is at or above the bottom of the interval at 0x8000, the procedure RENORMDx proceeds to step 3109 where the standard status variable is tested to determine whether the JBIG Standard or the ABIC standard is being employed. If the JBIG Standard is being employed, then the procedure RENORMDx may proceed to steps 3110 and 3112. Steps 3110 and 3112 are optional in the Qx-Coder's implementation of the JBIG Standard and hence are shown with dashed lines in FIG. 31. In step 3110, the counter value CT is once again tested to determine if it is equal to zero, thereby indicating a byte needs to be inserted into the code register C via step 3112. If the counter value CT does not equal zero, then a byte does not have to be inserted into the code register C and the procedure RENORMDx ends. If the ABIC standard is being employed, the procedure RENORMDx ends.

Procedure BYTEINx

Figure 32:
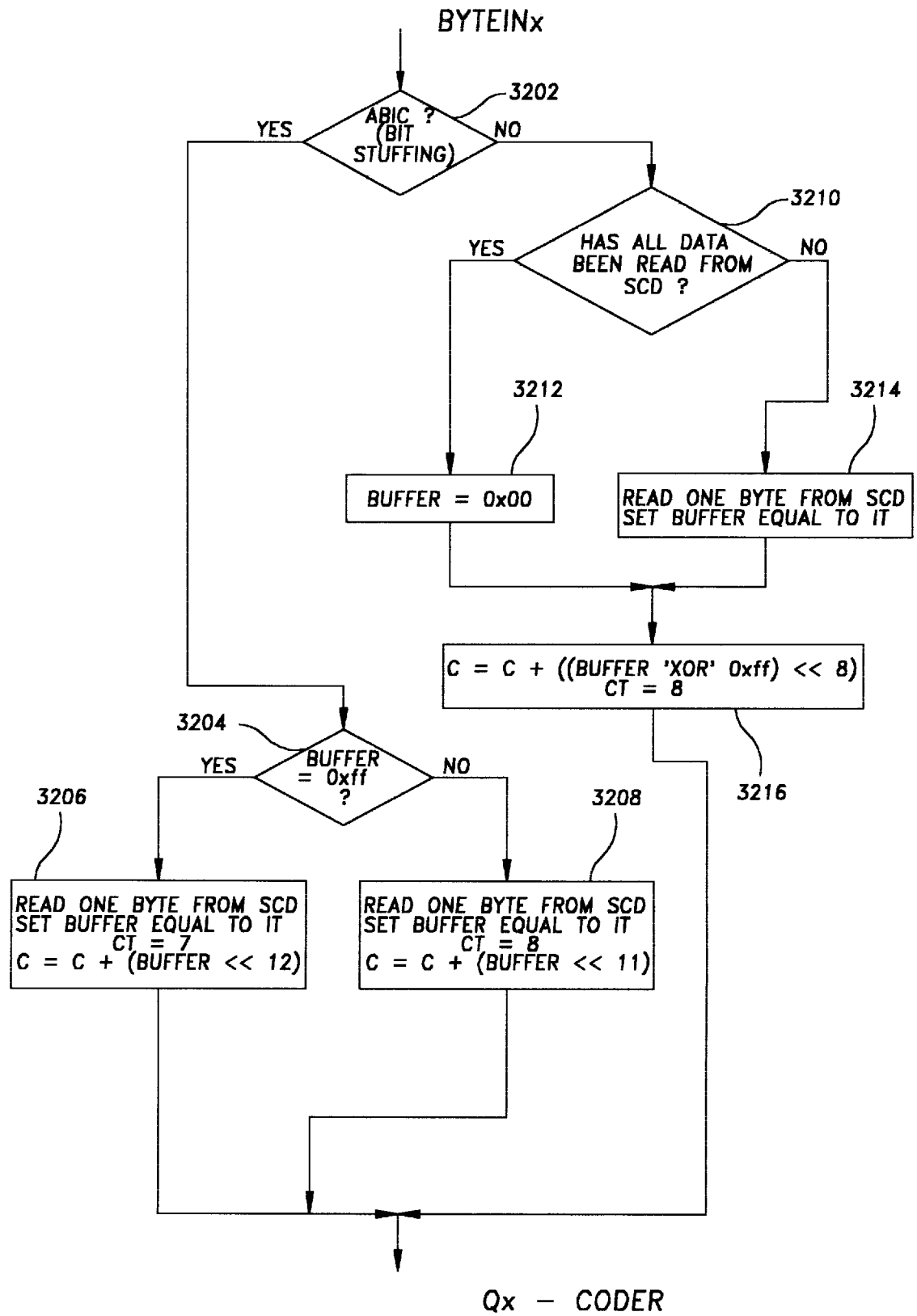

The procedure BYTEINx reads data from the stripe coded data SCD one byte at time and is illustrated in FIG. 32. The procedure BYTEINx starts in step 3202 where the procedure must determine whether the ABIC or JBIG Standard is being employed. The specific test in step 3202 examines whether bit stuffing, that is, the ABIC standard is required. If so, the procedure BYTEINx proceeds to step 3204. In step 3204, BUFFER is tested to determine whether it is equal to 0xff. If BUFFER equals 0xff, then BYTEINx proceeds to step 3206. In step 3206, one byte is read from the stripe coded data SCD and BUFFER is set equal to it. Additionally, the counter value CT is set equal to 7 because a stuffed bit must be removed from BUFFER and the code register C is set equal to its contents added to a binary left shifted BUFFER by 12 bits which resolves the carry, or stuffed bit. If BUFFER does not equal 0xff in step 3204, then BYTEINx proceeds to step 3208. In step 3208, one byte is read from the stripe coded data SCD and BUFFER is set equal to it. Additionally, the counter value CT is set equal to 8 because there is no stuffed bit that must be removed from BUFFER and the code register C is set equal to its contents added to a binary left shifted BUFFER by 11.

If, in step 3202, the JBIG Standard is being employed, the procedure BYTEINx proceeds to step 3210. In step 3210, a determination is made as to whether all of the data from the stripe coded data SCD has been read. If so, the procedure BYTEINx proceeds to step 3212 where BUFFER is set 0x00 which is, in effect, the reverses the "PACMAN" effect of the encoder described supra. If more data remains in the SCD, then the procedure BYTEINx proceeds from step 3210 to 3214. In step 3214, one byte from the SCD is read and BUFFER is set equal to it. From either steps 3212 or 3214, the procedure BYTEINx proceeds to step 3216. In step 3216, the output buffer C is adjusted by adding to its contents an inverted BUFFER (i.e. BUFFER 'XOR' 0xff) that is binary left shifted by 8 bits. The inversion of BUFFER is necessary because the hardware standard of the present invention is inverted from the software standard defined by the JBIG International Standard. Accordingly, the hardware must invert the byte loaded from SCD into BUFFER. Additionally, the counter value CT is set to eight.

Although the present invention has been described with respect to the JBIG Standard, it is equally applicable to the JPEG International Standard ISO/IEC 10918-1 (hereinafter JPEG standard) for encoding and decoding images. In general, the difference between the JPEG and JBIG Standards is that the JBIG Standard's model is for bi-level image data whereas the JPEG Standard's model is for continuous-tone image data. Both standards still, however, utilize the same QM-Coder. Therefore, the methods and apparatuses taught by the present invention may be applied to the JPEG Standard by those skilled in the art, as well as to the JBIG Standard.

While the present invention has been illustrated by the description of embodiments thereof, and while the embodiments have been described in considerable detail, such descriptions are not intended to restrict or in any way limit the scope of the appended claims to such detail. Additional advantages and modifications will readily appear to those skilled in the art. For example, the register bit assignments and sizes may be varied and still be held in accordance with the teachings of the present invention. Additionally, the registers may point to a base of an interval, a top of an interval, or to two sides of an interval. In such cases, those skilled in the art may include additional logic to reconcile the register contents and assignments with the applicable arithmetic coding standard. Therefore, the invention, in its broader aspects, is not limited to the specific details, the representative apparatus, and illustrative examples shown and described. Accordingly, departures may be made from such details without departing from the spirit or scope of the Applicants' general inventive concept.

We claim:

1. In a computer system for compression encoding of digital images having a code register and an interval size register, wherein the code register comprises at least 16 bits and a boundary of an interval and the interval size register comprises an interval length, a method of terminating compression encoding of digital images employing a JBIG standard, the method of terminating encoding comprising the steps of:

(a) reading the 16th bit of the code register;

(b) comparing the 16th bit of the code register to a first state;

(c) if the 16th bit of the code register is equal to the first state, adding the low order 15 bits of the interval size register to the low order 16 bits of the code register; and (d) setting the state of the low order 15 bits of the code register to a second state.

2. The method of claim 1 further comprising the step of outputting the code register contents.

3. The method of claim 1 further comprising the step of inverting the code register.

4. In a computer system for compression encoding of digital images having a code register and an interval size register, wherein the code register comprises a boundary of an interval and the interval size register comprises an interval length, a method of compression encoding of digital images employing a JBIG standard, the method comprising the steps of:

(a) initializing an encoder procedure, wherein the step comprises the steps of:
  (1) storing an interval length value in the interval size register; and
  (2) storing a boundary value in the code register;

(b) encoding at least one pixel value; and (c) terminating the step of encoding, wherein the step comprises the steps of:
  (1) reading a 16th bit of the code register;
  (2) comparing the 16th bit of the code register to a first state;
  (3) if the 16th bit of the code register is equal to the first state, adding the low order 15 bits of the interval size register to the low order 16 bits of the code register; and
  (4) setting the state of the low order 15 bits of the code register to a second state.

5. The method of claim 4 further comprising the step of outputting the code register contents.

6. The method of claim 4 further comprising the step of inverting the code register.

7. A circuit for compression encoding of digital images employing a JBIG standard comprising:

(a) a code register for storing a boundary of an interval, wherein the code register comprises at least 16 bits that include a low order 15 bit segment, and wherein each bit of the code register includes a state;

(b) an interval size register for storing an interval length value, wherein the interval size register comprises at least 16 bits that include a low order 15 bit segment, and wherein each bit of the interval size register includes a state;

(c) encoder logic for encoding pixel data; and (d) termination logic for terminating the encoding of pixel data, wherein the termination logic comprises:
  (1) logic for adding the low order 15 bits of the interval size register to the low order 15 bits of the code register;
  (2) logic for determining the state of the 16th bit of the code register; and
  (3) logic for setting the state of the low order 15 bits of the code register.

8. The circuit of claim 7 wherein the logic for adding the low order 15 bits of the interval size register to the low order 15 bits of the code register comprises an arithmetic logic unit.

9. A method of implementing a JBIG and an ABIC compression/decompression standard in a common hardware structure, wherein the common hardware structure includes a code register having a code register bit assignments and an interval size register having interval size register bit assignments, the method comprising the steps of:

(a) determining whether a JBIG or an ABIC standard is required;

(b) modifying the code register bit assignments if an ABIC standard is required, wherein the step of modifying the register bit assignments includes the step of shifting the code register bit assignments by 3 bits; and (c) modifying the interval size register bit assignments if an ABIC standard is required, wherein the step of modifying the interval size register bit assignments includes the step of shifting the interval size register bit assignments by 3 bits.

10. The method of claim 9 further comprising the step of inverting stripe coded data if the JBIG standard is required.

11. A hardware architecture for implementing a JBIG and an ABIC compression/decompression standard, wherein the architecture comprises:

(a) a code register having a code register bit assignments;

(b) an interval size register having interval size register bit assignments;

(c) logic for determining whether a JBIG or an ABIC standard is required;

(d) logic for modifying the code register bit assignments if an ABIC standard is required, wherein the logic for modifying the code register bit assignments includes logic for shifting the code register bit assignments by 3 bits; and (e) logic for modifying the interval size register bit assignments if an ABIC standard is required, wherein the logic for modifying the interval size register bit assignments includes logic for shifting the interval size register bit assignments by 3 bits.

* * * * *